US008918753B2

(12) United States Patent
Akar et al.

(10) Patent No.: US 8,918,753 B2
(45) Date of Patent: Dec. 23, 2014

(54) CORRELATION OF DEVICE MANUFACTURING DEFECT DATA WITH DEVICE ELECTRICAL TEST DATA

(71) Applicant: Teseda Corporation, Portland, OR (US)

(72) Inventors: Armagan Akar, Portland, OR (US); Ralph Sanchez, Portland, OR (US)

(73) Assignee: Teseda Corporation, Portland, OR (US)

(*) Notice: Subject to any disclaimer, the term of this patent is extended or adjusted under 35 U.S.C. 154(b) by 0 days.

(21) Appl. No.: 14/025,712

(22) Filed: Sep. 12, 2013

(65) Prior Publication Data

US 2014/0115551 A1 Apr. 24, 2014

Related U.S. Application Data

(63) Continuation of application No. 13/151,018, filed on Jun. 1, 2011, now Pat. No. 8,539,389.

(51) Int. Cl.
| | |
|---|---|
| G06F 17/50 | (2006.01) |
| G11C 29/56 | (2006.01) |
| G06F 11/00 | (2006.01) |
| G01R 31/00 | (2006.01) |
| G01R 27/28 | (2006.01) |
| G01R 31/28 | (2006.01) |

(52) U.S. Cl.
CPC ........ *G06F 17/5081* (2013.01); *G06F 17/5068* (2013.01); *G06F 11/008* (2013.01); *G01R 31/00* (2013.01); *G01R 27/28* (2013.01); *G01R 31/2803* (2013.01); *G01R 31/281* (2013.01); *G06F 17/5022* (2013.01); *G11C 29/56008* (2013.01); *G06F 2217/14* (2013.01)
USPC ............ 716/136; 716/110; 716/111; 716/112

(58) Field of Classification Search
CPC .............. G06F 17/5045; G06F 17/504; G06F 17/5068; G06F 17/5081; G06F 2217/12; G06F 2217/14
USPC ........ 716/100–101, 106–107, 110–112, 136; 324/500, 512, 537
See application file for complete search history.

(56) References Cited

U.S. PATENT DOCUMENTS

| | | | |
|---|---|---|---|
| 2,883,255 A | 4/1959 | Anderson | |
| 3,082,374 A | 3/1963 | Buuck | |

(Continued)

FOREIGN PATENT DOCUMENTS

| | | |
|---|---|---|
| EP | 0 283 610 A1 | 9/1988 |
| EP | 0 687 977 A2 | 12/1995 |

OTHER PUBLICATIONS

Kashyap, Chandramouli et al., "Silicon feedback to improve frequency of high-performance microprocessors—an overview," Published in Proceeding ICCAD '08 Proceedings of the 2008 IEEE/ACM International Conference on Computer Aided Design, 2008, 5 pages.

(Continued)

*Primary Examiner* — Stacy Whitmore
(74) *Attorney, Agent, or Firm* — Stolowitz Ford Cowger LLP

(57) ABSTRACT

Various embodiments related to correlating a location of a defect on a substrate for a semiconductor device to an electrical significance of a device structure at that location are disclosed. For example, one embodiment includes receiving a defect location for the location on the substrate where the defect was detected; receiving a physical representation of the semiconductor device for the defect location; generating a significance determination indicating whether the defect is located in an electrically significant region by correlating the defect location to logical and physical layout information included in the physical representation; and displaying the significance determination.

24 Claims, 20 Drawing Sheets

(56) References Cited

U.S. PATENT DOCUMENTS

| | | |
|---|---|---|
| 4,012,625 A | 3/1977 | Bowen |
| 4,434,489 A | 2/1984 | Blyth |
| 4,646,299 A | 2/1987 | Schinabeck |
| 4,928,278 A | 5/1990 | Otsuji et al. |
| 5,490,151 A | 2/1996 | Feger |
| 5,696,771 A | 12/1997 | Beausang |
| 5,717,701 A | 2/1998 | Angelotti |
| 6,185,707 B1 | 2/2001 | Smith et al. |
| 6,275,023 B1 | 8/2001 | Oosaki et al. |
| 6,498,473 B1 | 12/2002 | Yamabe |
| 6,618,827 B1 | 9/2003 | Benavides |
| 6,628,141 B1 | 9/2003 | Alt |
| 6,775,796 B2 | 8/2004 | Finkler |
| 6,832,122 B1 | 12/2004 | Huber |
| 6,836,136 B2 | 12/2004 | Aghaeepour |
| 6,882,950 B1 | 4/2005 | Jennion |
| 6,883,115 B2 | 4/2005 | Sanada |
| 6,950,771 B1 | 9/2005 | Fan |
| 7,012,444 B2 | 3/2006 | Kojima |
| 7,071,833 B2 | 7/2006 | Nagano |
| 7,266,741 B2 | 9/2007 | Luk |
| 7,320,115 B2 | 1/2008 | Kuo |
| 7,512,508 B2 | 3/2009 | Rajski |
| 7,568,139 B2 | 7/2009 | Dokken |
| 7,571,422 B2 | 8/2009 | Adel |
| 7,574,682 B2 | 8/2009 | Ribiere-Cazaux |
| 7,729,884 B2 | 6/2010 | Huang et al. |
| 7,752,581 B2 | 7/2010 | Lanzerotti et al. |
| 7,876,120 B2 | 1/2011 | Awajl et al. |
| 7,987,442 B2 | 7/2011 | Rajski |
| 8,141,026 B1 | 3/2012 | Reilly et al. |
| 8,205,173 B2 | 6/2012 | Wu et al. |
| 8,343,781 B2 | 1/2013 | Kumar et al. |
| 8,412,991 B2 | 4/2013 | Ackerman |
| 8,453,088 B2 | 5/2013 | Akar |
| 8,539,389 B2 | 9/2013 | Akar |
| 8,560,904 B2 | 10/2013 | Ackerman |
| 8,626,460 B2 | 1/2014 | Kaufman |
| 2003/0046621 A1 | 3/2003 | Finkler |
| 2003/0046624 A1 | 3/2003 | Muhtaqroglu |
| 2003/0057990 A1 | 3/2003 | West |
| 2004/0049722 A1 | 3/2004 | Matsushita |
| 2005/0066294 A1 | 3/2005 | Templeton et al. |
| 2005/0071659 A1 | 3/2005 | Ferguson |
| 2005/0076316 A1 | 4/2005 | Pierrat et al. |
| 2005/0270165 A1 | 12/2005 | Nagano |
| 2005/0278670 A1 | 12/2005 | Brooks et al. |
| 2006/0031792 A1 | 2/2006 | Zavadsky et al. |
| 2006/0053357 A1 | 3/2006 | Rajski et al. |
| 2006/0066338 A1 | 3/2006 | Rajski |
| 2006/0066339 A1 | 3/2006 | Rajski |
| 2006/0085768 A1 | 4/2006 | Heng et al. |
| 2006/0111873 A1 | 5/2006 | Huang |
| 2006/0132165 A1 | 6/2006 | Walker et al. |
| 2006/0132166 A1 | 6/2006 | Walker |
| 2006/0161452 A1 | 7/2006 | Hess |
| 2006/0279310 A1 | 12/2006 | Walker et al. |
| 2007/0011517 A1 | 1/2007 | Boyce |
| 2007/0016879 A1 | 1/2007 | Kuo |
| 2007/0143718 A1 | 6/2007 | Abercrombie et al. |
| 2007/0226570 A1 | 9/2007 | Zou |
| 2008/0040637 A1 | 2/2008 | Huang |
| 2008/0091981 A1 | 4/2008 | Dokken et al. |
| 2008/0148201 A1 | 6/2008 | Lanzerotti et al. |
| 2008/0209365 A1 | 8/2008 | Riviere-Cazaux |
| 2008/0284453 A1 | 11/2008 | Swenton et al. |
| 2009/0177936 A1 | 7/2009 | Koenemann |
| 2009/0210183 A1 | 8/2009 | Rajski |
| 2010/0095177 A1 | 4/2010 | Forlenza |
| 2010/0122229 A1 | 5/2010 | Lo et al. |
| 2010/0164013 A1 | 7/2010 | Jaffe et al. |
| 2010/0306606 A1 | 12/2010 | Huang |
| 2010/0332172 A1 | 12/2010 | Kaufman et al. |
| 2011/0219346 A1 | 9/2011 | Lo et al. |
| 2011/0231722 A1 | 9/2011 | Mukherjee |
| 2011/0265157 A1 | 10/2011 | Ryder |
| 2011/0276935 A1 | 11/2011 | Fouquet et al. |
| 2012/0079439 A1 | 3/2012 | Akar |
| 2012/0079440 A1 | 3/2012 | Akar |
| 2012/0079442 A1 | 3/2012 | Akar |
| 2012/0161808 A1 | 6/2012 | Elias |
| 2013/0049790 A1 | 2/2013 | Frost |
| 2013/0061103 A1 | 3/2013 | Ackerman |
| 2013/0219237 A1 | 8/2013 | Ackerman |
| 2014/0115412 A1 | 4/2014 | Ackerman |

OTHER PUBLICATIONS

Stolowitz Ford Cowger, Listing of Related Cases, Apr. 3, 2014, 2 pages.

Per Pin Parametric Measurement Unit/Source Measure Unit: Analog Devices, Inc.; Sep. 2005; 24 pages.

```
//%BEGIN AOI222
*CELLDEFINE
MODULE AOI222 (A0,A1,B0,B1,C0,C1,Y);
  INPUT A0,A1,B0,B1,C0,C1;
  OUTPUT Y
  WIRE INT_RES_0,INT_RES_1,INT_RES_2
  /////////////////////////////
  // FUNCTIONALITY//
  /////////////////////////////
  AND(INT_RES_0,A0,A1);
  AND(INT_RES_1,B0,B1);
  AND(INT_RES_2,C0,C1);
  NOR(Y,INT_RES_0,INT_RES_1,INT_RES_2);
  /////////////////////////////
  //     TIMING     //
  /////////////////////////////
  SPECIFY
   SPECPARAM TPD_A0_Y=0;
   SPECPARAM TPD_A1_Y=0;
   SPECPARAM TPD_B0_Y=0;
   SPECPARAM TPD_B1_Y=0;
   SPECPARAM TPD_C0_Y=0;
   SPECPARAM TPD_C1_Y=0;
   (A0=>Y)=TPD_A0_Y;
   (A1=>Y)=TPD_A1_Y;
   (B0=>Y)=TPD_B0_Y;
   (B1=>Y)=TPD_B1_Y;
   (C0=>Y)=TPD_C0_Y;
   (C1=>Y)=TPD_C1_Y;
  END SPECIFY
  END MODULE
*END CELLDEFINE //
%END AOI222
```

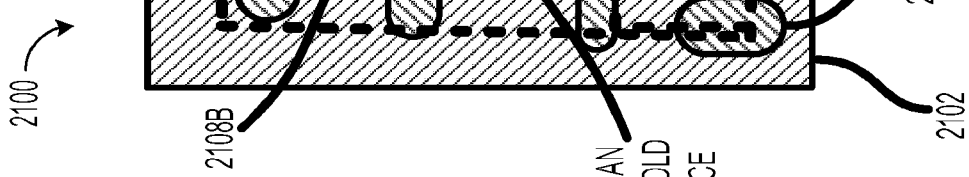
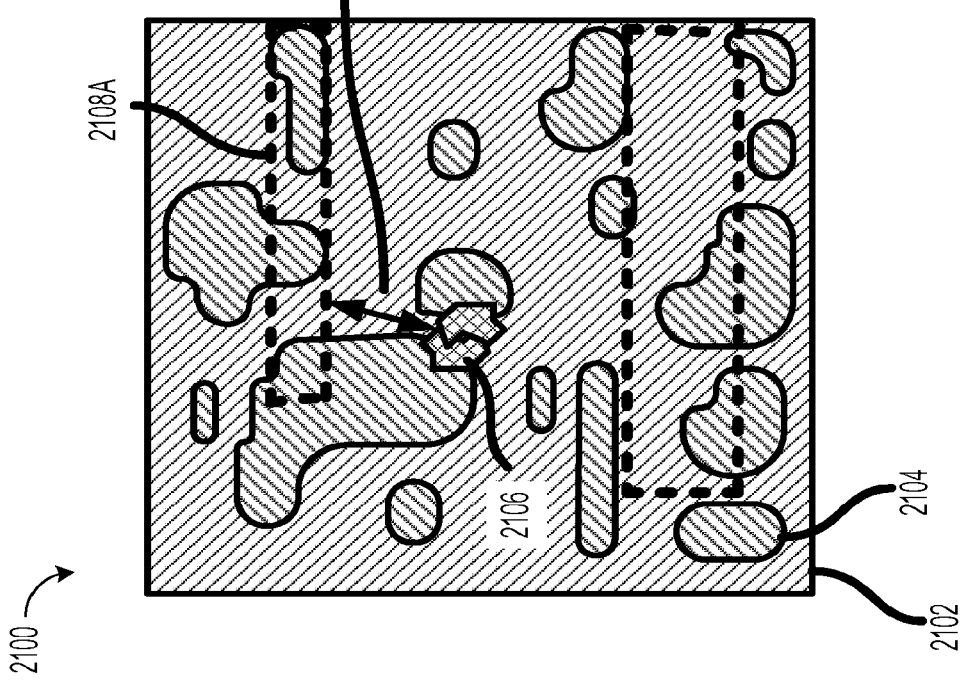

CORRELATION OF DEVICE MANUFACTURING DEFECT DATA WITH DEVICE ELECTRICAL TEST DATA

RELATED APPLICATIONS

This application is a continuation of U.S. patent application Ser. No. 13/151,018 filed on Jun. 1, 2011, now U.S. Pat. No. 8,539,389, and claims priority to U.S. Provisional Patent Application Ser. No. 61/386,947, filed Sep. 27, 2010, and to U.S. Provisional Patent Application No. 61/460,307, filed Dec. 29, 2010, all of which are incorporated by reference herein for all purposes.

COPYRIGHT NOTICE

© 2012-2013 Teseda Corporation. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71 (d).

BACKGROUND OF THE INVENTION

The present disclosure is related to front end and back end design for test (DFT) processes by which an abstract logical computer model can be implemented in prototype silicon. In such a setting, it is desirable to provide a mechanism for testing the prototype silicon to determine the potential location of physical defects that may contribute to the creation of functional failures detected by measurement of an applied stimulus.

SUMMARY OF THE INVENTION

The present description contemplates a suite of testing methods and feedback mechanisms that provide high granularity location information about potential physical defects that may create detected functional failures. The feedback may be employed to allow a back end customer to identify specific faults and their locations within the silicon implementation. This is a significant advance over prior methods, in that the back end customer now has specific and locational functional failure information, without requiring the full design information that is used at the front end.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 11 shows another embodiment of a layout exchange format (LEF) that describes the logical design shown in FIG. 7.

FIG. 21A schematically shows an embodiment of a clipping and a physical layout for an Nth-layer of a semiconductor device.

FIG. 21B schematically shows the clipping of FIG. 21A and a physical layout for an (N+1)th-layer of the semiconductor device shown in FIG. 21A.

DETAILED DESCRIPTION OF PREFERRED EMBODIMENTS

Detailed Description

A wide variety of tools are available to enable design and modeling of semiconductor device functionality that will ultimately be implemented in silicon. Many of these tools allow a designer to create, in a front end of the process, a computer language logical description representing the logical flow and functional operation of the ultimate device. In a back end, a computer language hardware description may be implemented representing the physical layout of the integrated semiconductor device. This physical description is used to create an actual piece of silicon, such as a die, that may be tested through application of test stimulus patterns.

Figure 1:
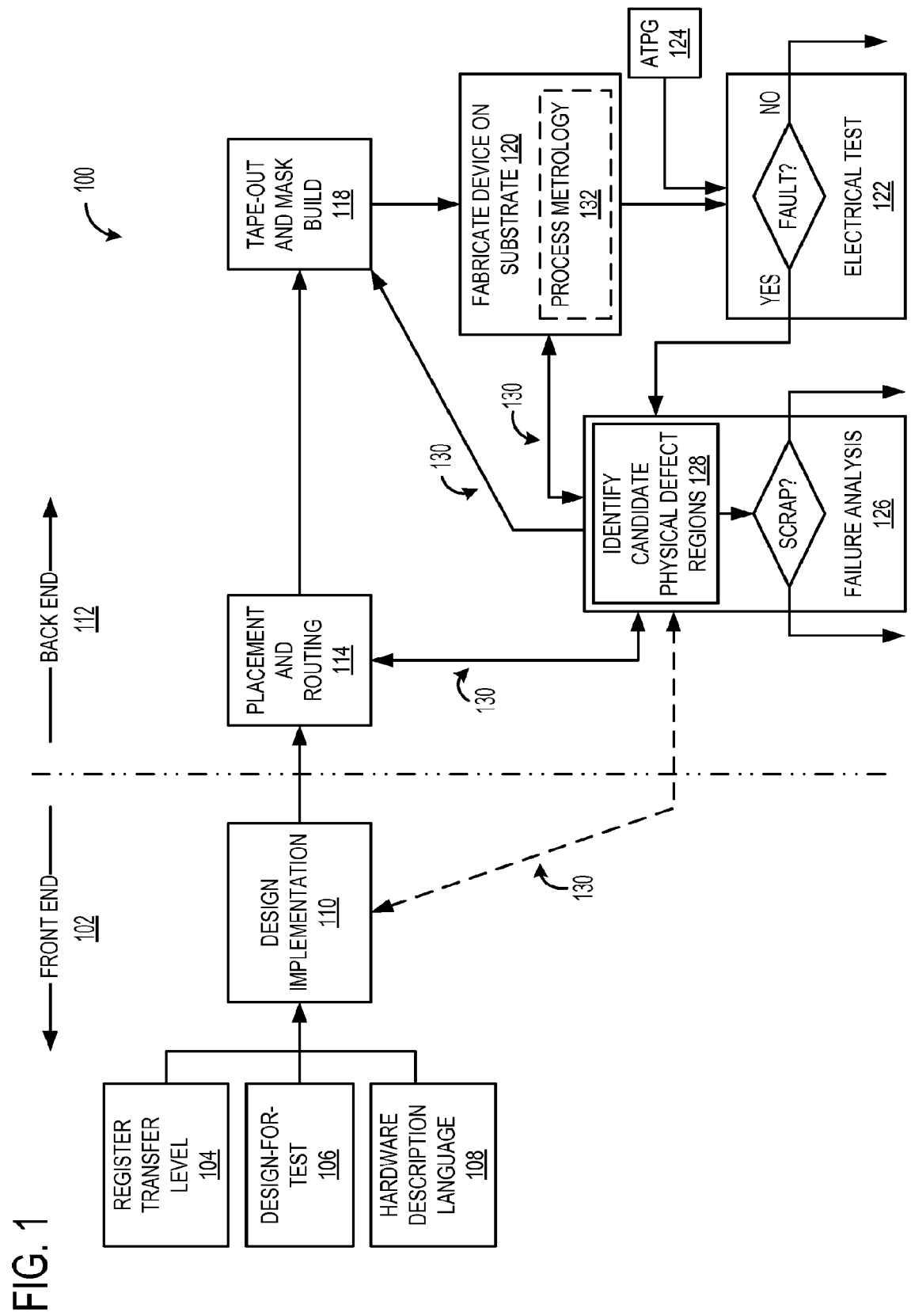
FIG. 1 shows a schematic overview of an embodiment of a design and manufacturing process for a semiconductor device.

For example, FIG. 1 shows a schematic overview of an embodiment of an example design and manufacturing process 100 for a semiconductor device. In front end 102, abstract descriptions of the device's logical functionality are synthesized into a computer language design implementation 110. In the example shown in FIG. 1, information from a register transfer level language description 104 of the device, a design-for-test description 106 of the device, and a hardware description language description 108 of the device is used to form design implementation 110. Design implementation 110 may then be rendered into a physical layout from which various manufacturing masks may be created. In a placement and routing phase 114, the various logical cells of design implementation 110 may be rendered as polygons. Such polygons represent "footprints" for the physical instantiations of the logical cells in the physical layout of the device. In other words, polygons form the boundaries of the physical space that a device structure will occupy when the physical layout is rendered in silicon. Thus, during placement and routing phase 114, the various polygons are placed in the physical layout, arranged according to various design rules (e.g., structure density, wire line length, etc.) and assigned X-Y coordinates that identify the physical location of the polygons (and the associated logical cells) in the physical layout. Once placed, wires are routed among the placed polygons to interconnect the polygons, forming nets. The resulting physical layout may be checked for design logic flaws during a verification portion of placement and routing phase 114 and passed to a tape-out and mask build phase 118 where lithographic photomasks are built. The photomasks for each layer may then be sent to a semiconductor fab where the physical layout is rendered into a silicon implementation at fabrication phase 120. Suitable defect and process metrology tools may be used at process metrology phases 132 of fabrication phase 120 to monitor device manufacturing.

The resulting silicon implementation may be electrically tested at electrical test phase 122 to identify physical defects introduced during manufacturing. Physical defects may cause a functional failure of the logical operation within a die, potentially resulting in low die yield. As shown in FIG. 1, an automatic test pattern generation (ATPG) phase 124 distinguishes functioning circuits from failing circuits exhibiting electrical test mismatches. If failing, a defective die may be sent to a failure analysis phase 126 to identify the physical defects causing the functional failures.

The process of finding physical defects can be time-consuming because conventional tests may provide little or no information about the location in the silicon that is causing the functional failure. Because automated test and electronic design software are often tuned toward device design (rather than defect diagnosis), it can be cumbersome to translate the physical failure data into input suitable for electronic design software and, once processed by the design software, into a possible physical location for the root cause defect on the die. The potential physical location for the defect is then checked by destructive testing (e.g., by cutting a die and imaging the cross-section, such as by a suitable electron microscopy technique). If the possible location was incorrect, the process starts again. Meanwhile, manufacturing may be held up and/or defective die may continue to be produced while the defect mode is tracked and isolated. Further, because the electronic design software is typically available to device architects rather than failure analysis engineers, defect isolation may pull architects and electronic design tools away from other tasks to assist in failure analysis, potentially adding to the expense of the excursion and delaying other projects.

Accordingly, embodiments of methods and hardware are described herein for identifying, within a candidate defect region of a physical portion of a die, a potential physical defect observed by a test circuit. The candidate region is defined within the physical domain of the device and includes a region of the device that is likely to include the physical defect causing the electrical test mismatch. Put another way, the candidate defect region exists within the realm of the physical instantiations of the structures that provide logical function to the device. Because it is during fabrication of these structures that such defects are typically formed, framing the defect investigation within the physical realm may provide a faster route to defect identification compared to investigations rooted in the logical design alone.

For example, one or more test circuits may observe a functional failure associated with the physical defect. Such observations may be used to generate a suspect logical region that includes the physical circuitry functionally affected by the defect. Such a suspect logical region may include a portion of a net on one or more layers of the device electrically connected with one or more logic cones (or portions thereof) observed by the test circuits reporting the failure. However, while logical design information provides the functional and connectional information related to the suspect logical region, the suspect logical region is defined with reference to the physical device structure (e.g., with reference to physical coordinates for locations of the various components and interconnects within the device). Thus, generating the suspect logical region provides a way to physically localize structures related to functionally failing circuits for subsequent defect isolation and confirmation. Accordingly, the suspect logical region may be defined with reference to physical locations for logic cones, nets, or any suitable portions thereof, so that a user may understand the functional effects of defects at various positions within the device without a detour via electronic design software approaches. Because the suspect logical region combines physical and functional descriptions of the device, a user may track down a physical location for the defect according to the observed functional failure with reference to the functional description of the structures within the suspect logical region. It will be appreciated that, as used herein, the suspect logical region may include structures forming analog and memory portions of the device as well as structures forming logic regions of the device.

For example, an embodiment of a method comprising identifying the candidate defect region from physical location information for a suspect logical region identified from one or more electrical test mismatches (such as a suspect logical region formed by an overlapping portion of logic cones related to the observed mismatches) is disclosed. In such an embodiment, the candidate defect region is defined by physical coordinates that correspond to the suspect logical region. Once identified, the candidate defect region may be displayed to a user as feedback for further investigation. The candidate defect region may be refined and/or confirmed by logical simulation and/or by additional electrical testing without needing additional access to front end design information or personnel, potentially reducing the failure analysis turnaround time.

Further, embodiments of methods and hardware are described for providing encrypted physical representation information for electrically significant regions (i.e., regions of the device where a physical defect may degrade or disable device functionality) of the die to an in-line defect metrology system and/or correlating defect process metrology data with physical representation information. Thus, manufacturing business decisions may be made without exposing front-end design information to the factory. In one example, this approach may provide helpful defect reduction information to a chip foundry while protecting sensitive device design information.

In the example shown in FIG. 1, during a candidate defect region identification phase 128, location information for potential physical defects may be reported at 130 to various portions of front end 102 and back end 112, including, but not limited to, design implementation phase 110, placement and routing phase 114, tape-out and mask build phase 118, fabrication phase 120, and/or process metrology phase(s) 132. Such approaches may narrow the physical space of the die that the user inspects, potentially saving time spent on preparing and imaging samples of the device, and potentially improving the speed of an information cycle during process development. In some examples, a two-week failure analysis process may be reduced to a two- or three-day process.

It will be appreciated that, in some embodiments, the methods described herein may be performed programmatically in whole or in any suitable portion by a suitable failure analysis computing device (described in more detail below). Additionally or alternatively, in some embodiments, portions of the methods described herein may be performed by user interaction with a failure analysis computing device via a suitable user interface, examples of which are described in more detail below.

Figure 2:
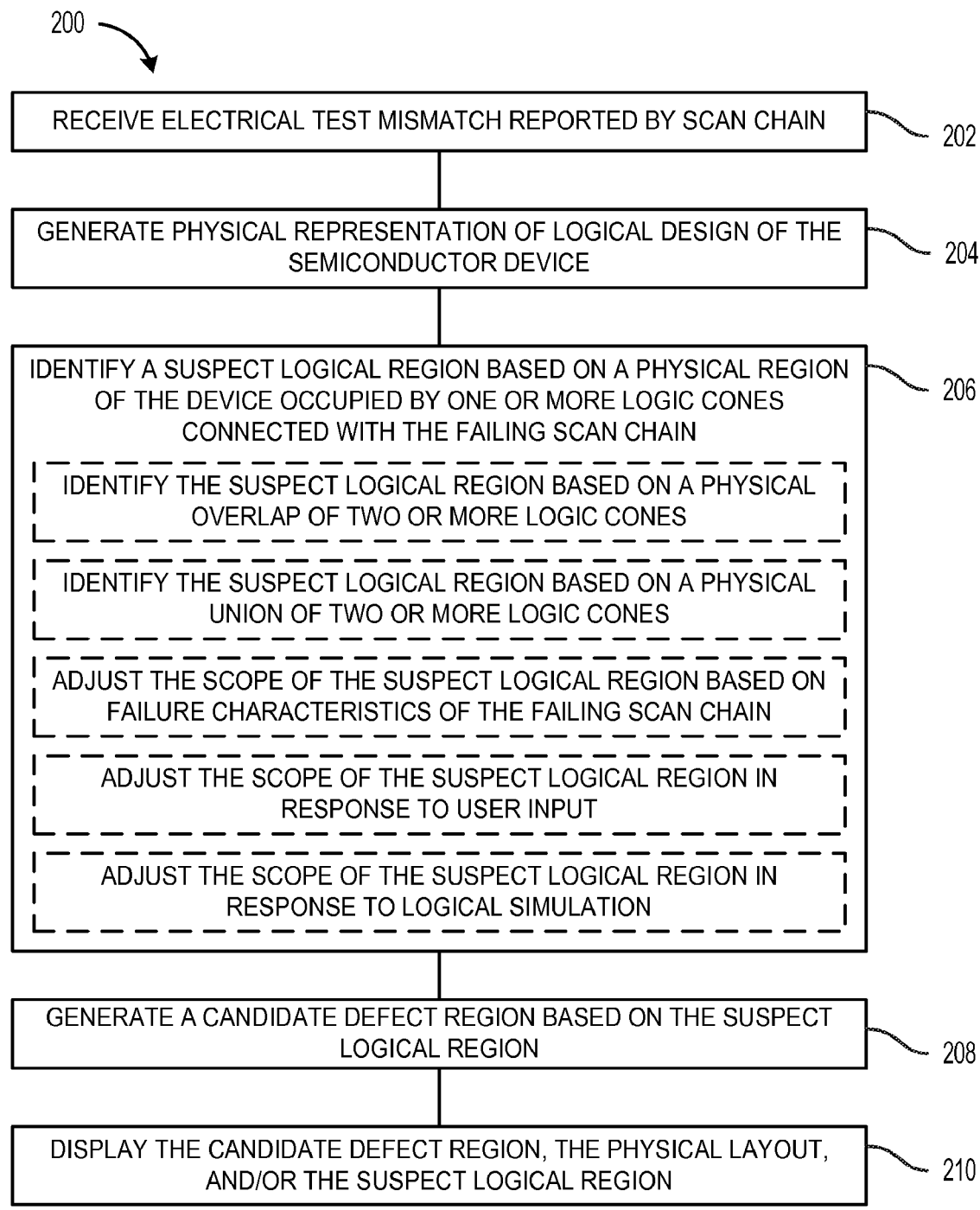
FIG. 2 shows a flow chart illustrating an embodiment of a method for generating a physical candidate defect region in a semiconductor device based on an electrical test mismatch for the device.

FIG. 2 shows a flow chart for an embodiment of a method 200 for identifying a candidate defect region including a physical defect in a semiconductor device. Method 200 comprises, at 202, receiving an electrical test mismatch. As used herein, an electrical test mismatch is a difference between an expected electrical test value and an observed electrical test value. One or more electrical test mismatches may be observed by test equipment used in connection with one or more scan chains included in the semiconductor device. In one non-limiting example, electrical test mismatches may be reported from an ATPG test unit, such as an ATPG unit used in ATPG phase 124 in FIG. 1.

As used herein, a scan chain represents a logical path between a scan chain input, where a test pattern is launched, and a scan chain output, where the test pattern is captured for evaluation. Scan chains observe and control logic for test purposes. A scan chain includes one or more logical cells that perform known logical operations on the test pattern. The logical cells included in the scan chain are sometimes referred to as "scan cells" to differentiate them from logical cells electrically connected with the scan chain but not included in the scan chain ("non-scan cells"). Thus, in some examples, data flowing along a scan chain may be input to a scan cell from one or more scan cells and/or non-scan cells, and output from the scan cell to one or more scan cells and/or to one or more non-scan cells. Scan chains may be arranged throughout the device design to provide test coverage of a predetermined portion of the physical layout of the device. Thus, in one non-limiting example, scan chains for a semiconductor device may cover 98% or more of a semiconductor device when rendered into silicon, so that a test routine for the device may be able to detect most or all of the fabrication defects (within an acceptable tolerance).

Figure 3:
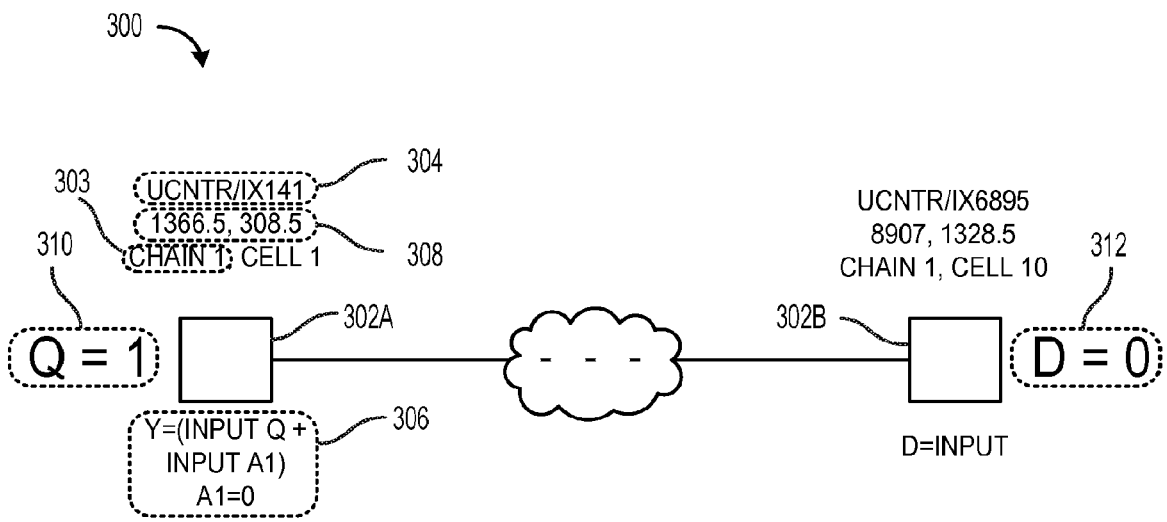
FIG. 3 schematically shows an embodiment of a scan chain.

FIG. 3 shows an embodiment of an example scan chain 300 identified by a scan chain instance name 303. As shown in the example of FIG. 3, scan chain 300 includes a plurality of scan cells (two of which are denoted individually as 302A and 302B in FIG. 3), though some example scan chains 300 may include only one scan cell. As shown in FIG. 3, each scan cell has an associated logical cell instance name 304 that identifies each scan cell. Each scan cell also has associated logical operation information 306 that describes the logical transformation performed therein. For example, scan cell 302A, named "UCNTR/IX141," adds the values of inputs Q and A1 and outputs the result.

FIG. 3 also shows physical location information 308 for a respective physical instance of scan cells in scan chain 300. As shown in FIG. 3, scan cell 302A has a physical location information 308 identified as "1366.5, 308.5." Physical location information 308 may be X, Y coordinates for a physical layout of the device (such as the example shown in FIG. 3), but it will be appreciated that any suitable location information for scan cell may be represented as physical location information 308 without departing from the scope of the present disclosure.

FIG. 3 illustrates a test pattern 310 being launched at scan cell 302A and captured at scan cell 302B. In the example shown in FIG. 3, test pattern 310 includes a single "high" voltage input (e.g., test pattern 310 includes a value of 1), though it will be appreciated that any suitable test pattern may be launched without departing from the scope of the present disclosure. One non-limiting example of test pattern 310 includes an alternating pattern of a plurality of input values (e.g., 1, 0, 1, 0 . . . ) that may have any suitable duration with any suitable interval between values. In the example shown in FIG. 3, scan chain output 312 is observed as a single "low" voltage input (e.g., a value of 0). If scan chain output 312 was expected to have a value of 1 in the example shown in FIG. 3, the test equipment would report an electrical test mismatch for scan chain 300.

In some embodiments, the test equipment may store reports of electrical test mismatches in one or more failure files associated with the device; in these embodiments, receiving an electrical test mismatch may comprise receiving the failure file from the test equipment. Failure files may comprise information about one or more electrical test mismatches as well as information about non-failing test patterns and scan chains. Failure files may also include information about potential functional failure types associated with various electrical test mismatches included in the failure file.

Figure 4:
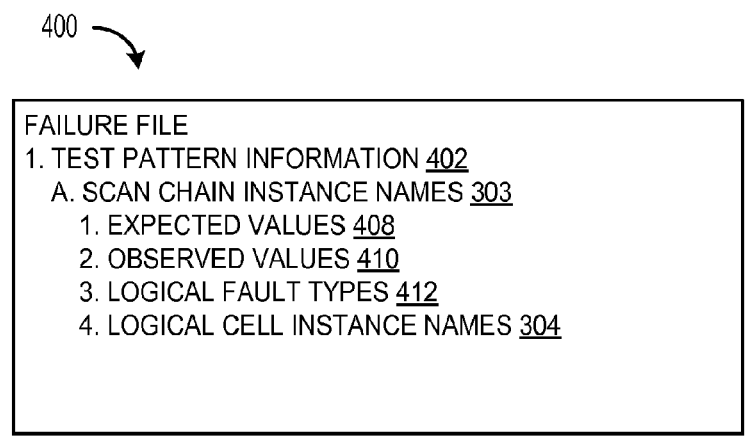
FIG. 4 schematically shows an embodiment of a failure.

An embodiment of an example failure file 400 is shown in FIG. 4. In the example shown in FIG. 4, failure file 400 includes test pattern information 402 related to an electrical test mismatch. As shown in the example presented in FIG. 4, test pattern information 402 includes scan chain instance names 303 for one or more scan chains 300 reporting the electrical test mismatch, logical cell instance names 304 electrically connected with each scan chain (e.g., instance names for scan cells and non-scan cells electrically connected with the scan chain), expected electrical test values 408, and observed electrical test values 410. Thus, in one example, a speed path test failure file may include a speed path scan chain instance name identifying the failing speed path scan chain, an expected speed path test value that would be captured if no electrical test mismatch was detected, and an observed speed path test value that reflects the captured speed path test signal. While the example failure file 400 is depicted in FIG. 4 as being a single file, it will be understood that a plurality of files may be used to describe the electrical test failure information for an example device without departing from the scope of the present disclosure.

In some examples, failure file 400 may include an optional functional failure type information 412 indicating a defect type (e.g., a short, an open, etc.) of which a test pattern 310 or scan chain 300 is representative. For example, a functional failure model describing how various defect types affect the logical operation of the scan chain or scan chains may be compared to observed electrical test values 410 to indicate functional failure type information 412.

If provided, in some embodiments, functional failure models may be prepared during front end 102 phases (for example, created concurrently with a design-for-test description 106 of the device). Such functional failure models may provide a comparatively greater amount of detail related to potential functional failures relative to functional failure models prepared during back end 112 phases, but may be comparatively less reflective of back-end placement and routing design changes such as those made during successive mask steppings.

Failure file 400 may be formatted according to any suitable computer-readable language without departing from the scope of the present disclosure. In one non-limiting example, failure file 400 may be formatted according to a test description language. Test description languages may facilitate the transfer of test vector data between test environments, such as computer-aided engineering (CAE) and automatic test equipment (ATE) environments. In some embodiments, failure files 400 may be formatted according to test description languages that specify test parameters, such as test format and pattern timing. In one non-limiting example, failure file 400 may be formatted according to a standard test interface language (STIL) provided by IEEE standards 1450-1999.

In some embodiments, failure file 400 may be configured to provide varying levels of detail for the device. For example, failure file 400 may be configured to provide electrical test mismatch results at the scan chain level, at the scan cell level, or at any other suitable level of data granularity.

Some design-for-test approaches may employ a test compression algorithm to reduce testing time, which may also reduce the testing cost. Some test compression algorithms may reduce testing time by convoluting the inputs and outputs of a plurality of scan chains 300 during testing. While the test compression algorithm may reduce testing time, the test compression algorithm may obscure scan chain- and/or scan cell-level electrical test mismatch information. Thus, in some embodiments, test compression algorithm information may be received, the test compression algorithm information including information for deconvoluting a test compression algorithm. Additionally or alternatively, in some embodiments, the test compression algorithm information may reference one or more scan chain instance names 303 (FIG. 3) associated with the electrical test mismatch via the test compression algorithm.

Turning back to FIG. 2, at 204, method 200 comprises generating a physical representation of a logical design of the semiconductor device. While the logical design may be organized to provide a user-friendly perspective on data flow within the device, placement and routing rules may cause the silicon implementation to appear different from the logical design. Because physical defects typically cause functional failures based on the location of the defect, generation of a physical representation may link a functional failure observed as an electrical test mismatch to a physical location within the device. Thus, the physical representation comprises location information for the physical instantiations of the logical cells and the logical interconnections included in the logical design.

Figure 5:
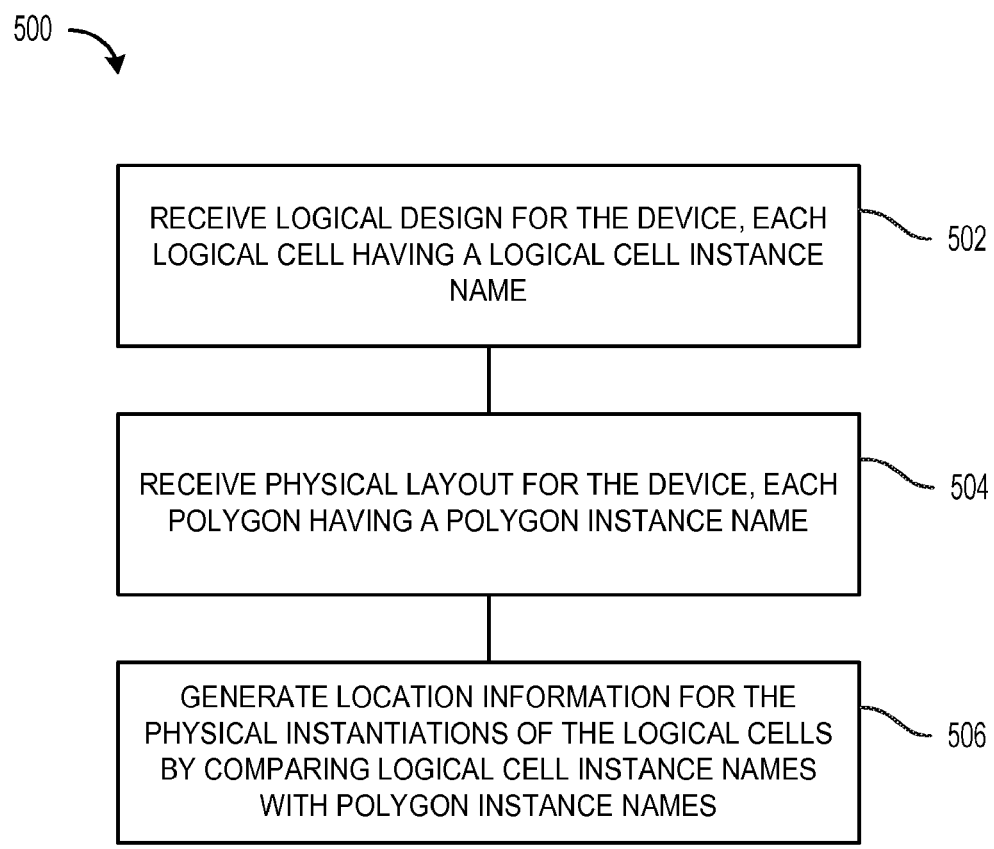
FIG. 5 shows a flow chart illustrating an embodiment of a method for generating a physical representation of a logical design for a semiconductor device.

FIG. 5 shows a flow chart illustrating an embodiment of a method 500 of generating a physical representation of a logical design for the device. At 502, method 500 comprises receiving a logical design for the device. At 504, method 500 comprises receiving a physical layout of the semiconductor device. At 506, method 500 comprises generating location information for the physical instantiations of the logical cells by comparing logical cell instance names with polygon instance names. The embodiment of method 500 illustrated in FIG. 5 will be explained below with reference to FIGS. 6-12.

Figure 6:
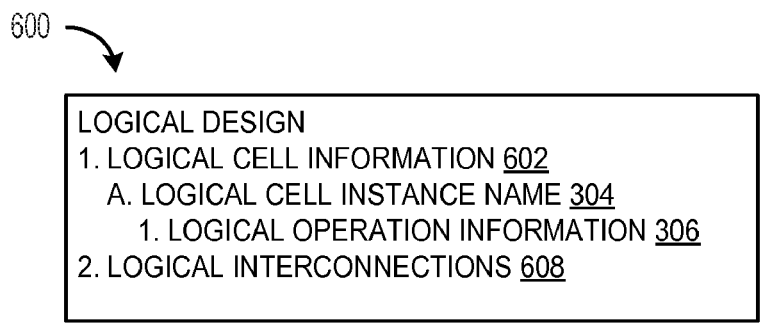
FIG. 6 schematically shows an embodiment of a logical design file.

FIG. 6 shows an embodiment of a logical design file 600 which comprises the logical design of a portion or the entire logical design for the device in a computer-readable language. While the example logical design file 600 is depicted in FIG. 6 as being a single file, it will be understood that a plurality of files may be used to describe the logical design of an example device without departing from the scope of the present disclosure.

As shown in FIG. 6, logical design file 600 includes logical cell information 602 and logical interconnection information 608. Logical cell information 602 includes one or more logical cell instance names 304 (FIG. 3) identifying each logical cell. In some embodiments, a logical cell instance name 304 for a particular logical cell may be a unique logical cell instance name that may be shared with a polygon placed in the physical layout for that particular logical cell. Logical interconnection information 608 may include a description of the logical connections among various logical cells that will be physically instantiated as wires and/or vias when the device is rendered in silicon. For example, for a particular logical interconnection, logical interconnection information 608 may include a pin list associated with the input and output of logical cells electrically connected by the particular logical interconnection.

Figure 7:
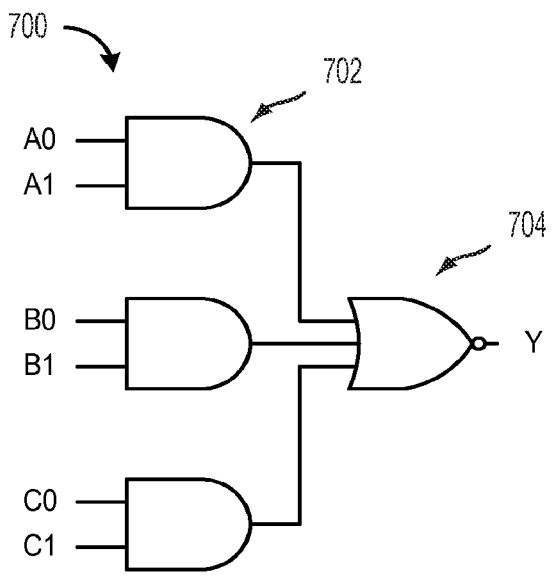
FIG. 7 schematically shows an embodiment of a logical design.

As shown in FIG. 6, logical design file 600 includes logical operation information 306 (FIG. 3) that describes the logical transformation performed at one or more logical cells 602. In some embodiments, logical cell 602 may comprise a single logical operation; an AND gate is one non-limiting example of a single logical operation. Alternatively, in some embodiments, logical cell 602 may comprise a plurality of logical operations. For example, FIG. 7 shows an embodiment of an example logical design 700 for a single logical cell comprising a plurality of logical operations schematically shown as AND gates 702 and an OR gate 704.

As explained above, logical design file 600 has a computer-readable format, such as a register transfer level language description of the logical design. For example, logical design file 600 may be formatted according to one or more of an integrated circuit hardware description language and an electronic design automation (EDA) language. Logical design file 600 may also include cross-reference (XREF) data, such as instance name data, and/or EDA scan information in some embodiments.

Figures 8, 9, 10:
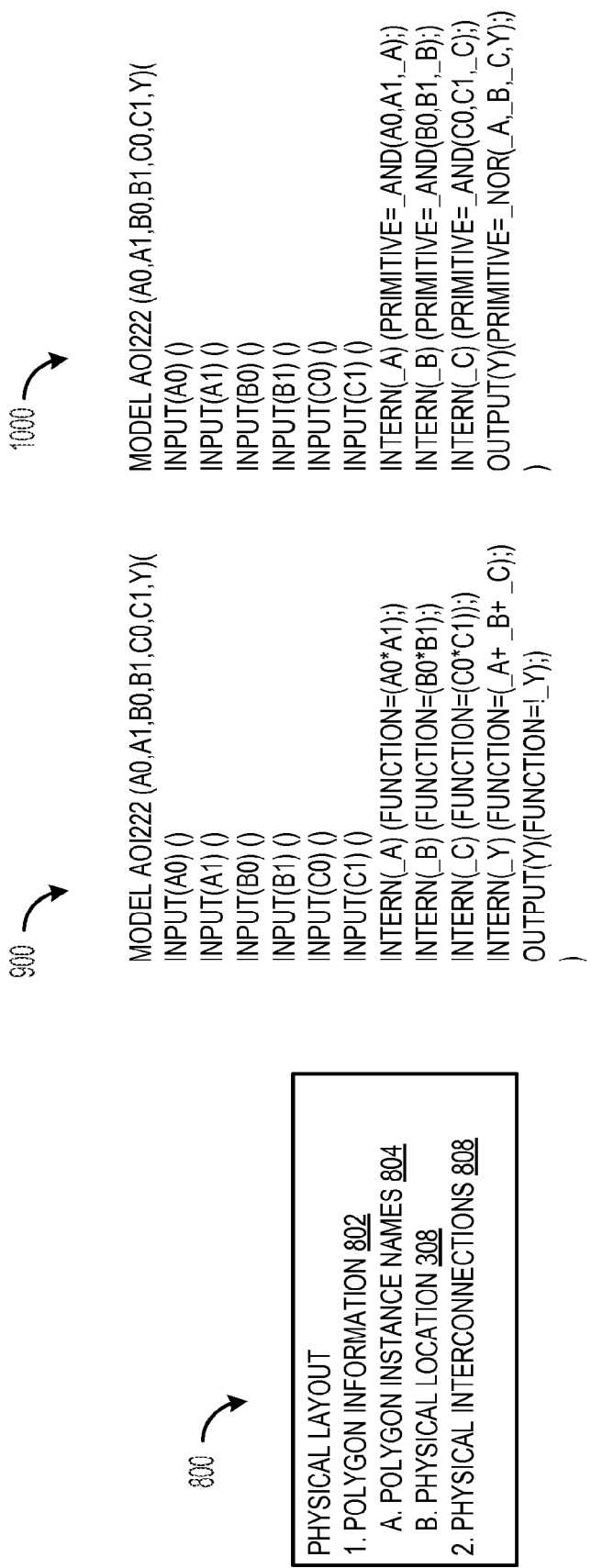
FIG. 8 schematically shows an embodiment of a physical layout file.
FIG. 9 shows an embodiment of a layout exchange format (LEF) that describes the logical design shown in FIG. 7.
FIG. 10 shows another embodiment of a layout exchange format (LEF) that describes the logical design shown in FIG. 7.

FIG. 8 schematically shows an embodiment of a physical layout file 800. As explained above, the physical layout comprises polygons corresponding to logical cells arranged according to routing and placement rules for the device. As shown in FIG. 8, physical layout file 800 is a computer-readable file that includes polygon information 802. Polygon information 802 includes one or more polygon instance names 804 that identify each polygon. In some embodiments, polygon instance name 804 may be a unique polygon instance name, though it will be appreciated that any suitable name for identifying the polygons included in the physical layout may be employed without departing from the scope of the present disclosure. While the example physical layout file 800 is depicted in FIG. 8 as being a single file, it will be understood that a plurality of files may be used to describe the physical layout of an example device without departing from the scope of the present disclosure.

As shown in FIG. 8, polygon information 802 includes physical location information 308 (FIG. 3) for each polygon. In some embodiments, physical layout file 800 may include physical interconnection information 808 for the respective physical interconnections linking the polygons.

Physical layout file 800 may be formatted according to a suitable integrated circuit hardware description language or a suitable EDA language. For example, the physical layout may be provided by one or more of a design exchange format (DEF) file and a layout exchange format (LEF) file. A DEF file may contain design-specific information for a circuit's logical design. Thus, in one scenario referencing the example shown in FIG. 7, a physical layout for logical design 700, including placement and routing information, may be represented in ASCII and stored in a DEF file. In another scenario, a LEF file containing placement and routing information and macro cell definitions derived from a library of logical structures (like VERILOG) may be included in physical layout file 800. For example, FIGS. 9-11 show embodiments of example LEF file representations of logical design 700 shown in FIG. 7.

Figure 12:
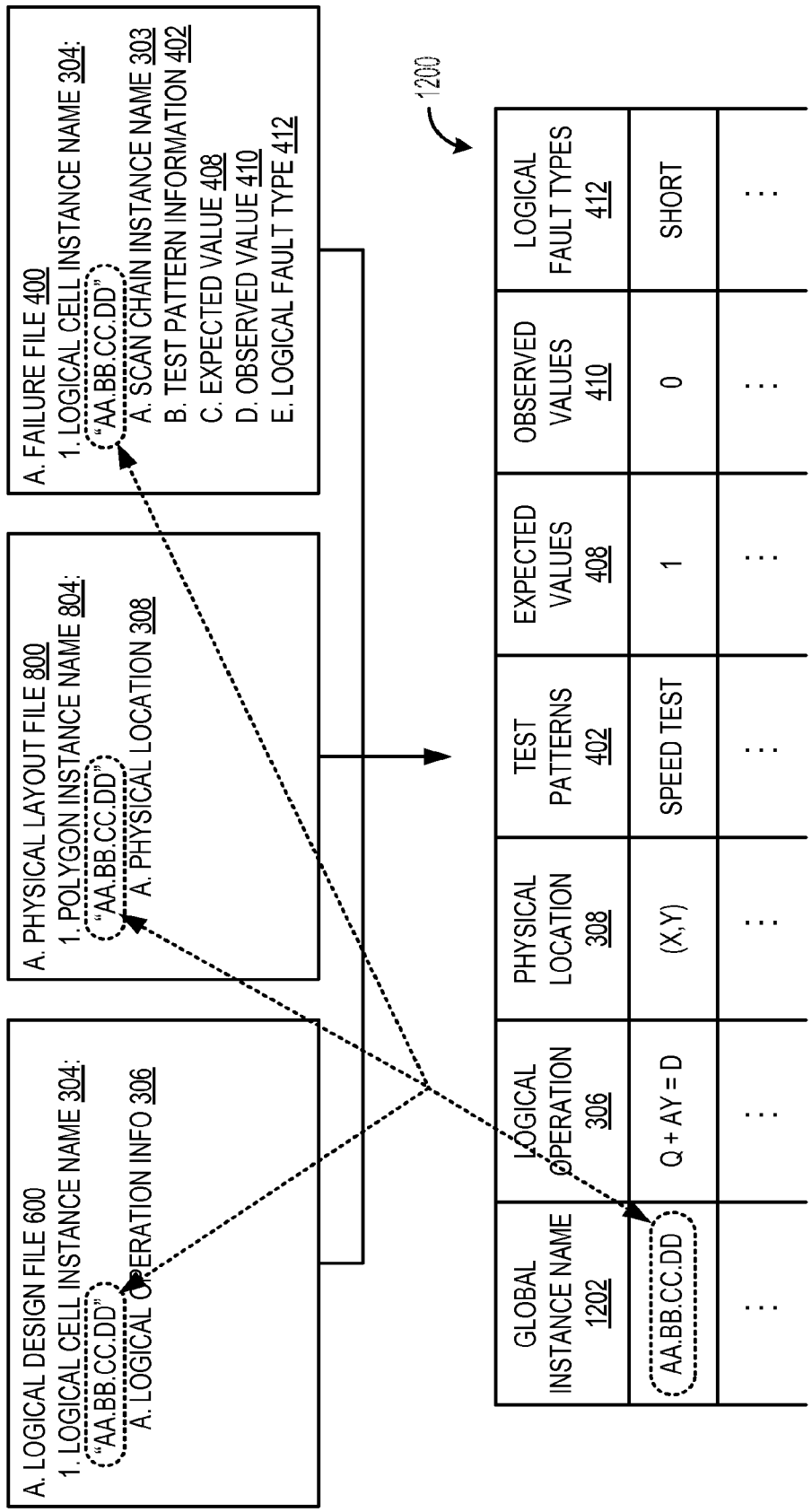
FIG. 12 schematically shows an embodiment of a physical representation for a semiconductor device.

FIG. 12 schematically shows an embodiment of a physical representation 1200 assembled from logical design file 600 and physical layout file 800. In the example shown in FIG. 12, physical representation 1200 comprises various logical, physical, and test attributes associated with a global instance name 1202 for the logical cells included in the device. For example, a particular logical structure may have a global instance name 1202 that is the same as a logical cell instance name 304 and a polygon instance name 804 for that particular logical structure. Consequently, by matching logical cell instance names 304 with corresponding polygon instance names 804, the logical design and the physical layout may be mapped together into physical representation 1200, so that the physical location of each logical cell may be mapped together with failure information (such as test pattern information 402, expected and observed test values, functional failure types 412, and scan chain instance names 303) electrically connected with a particular logical cell and the physical instantiation thereof.

In the example shown in FIG. 12, logical operation information 306 (FIG. 3) and physical location information 308 (FIG. 3) are stored in a lookup table format within physical representation 1200 according to global instance name 1202. However, it will be appreciated that physical representation 1200 may be arranged in any suitable way, including various hierarchical arrangements. As shown in FIG. 12, physical representation 1200 comprises physical location information 308 (such as physical coordinates) for each logical cell. Additionally or alternatively, in some embodiments, physical representation 1200 may comprise physical location information for a physical region of the device including more than one polygon.

In some embodiments, information from failure file 400 (FIG. 4) may be included in physical representation 1200. As shown in FIG. 12, test pattern information 402, expected electrical test values 408, observed electrical test values 410 and functional failure type information 412 associated with scan chain instances names 303 are stored in physical representation 1200 via cross-reference with global instance name 1202.

Turning back to FIG. 2, at 206, method 200 comprises identifying a suspect logical region electrically connected with a failing scan chain. As explained above, a failing scan chain includes one or more failing scan cells. The suspect logical region is identified based on a physical region of the device comprising the circuitry electrically connected with each failing scan cell (i.e., the logical cells that contribute to the logical state of the failing scan cell). Thus, the suspect logical region represents a physical region of the semiconductor device, including physical instantiations of the logical cells and interconnections (e.g., polygon information), which may be identified using the physical representation.

For example, in some embodiments, the suspect logical region may be defined to include a physical intersection (e.g., physically overlapping portions) of a plurality of logic cones electrically connected with the scan chains reporting failures, while in others of such embodiments, the suspect logical region may be defined to include a physical union (e.g., all of the logical cells and interconnections in all of such logic cones) of such logic cones.

Figure 13:
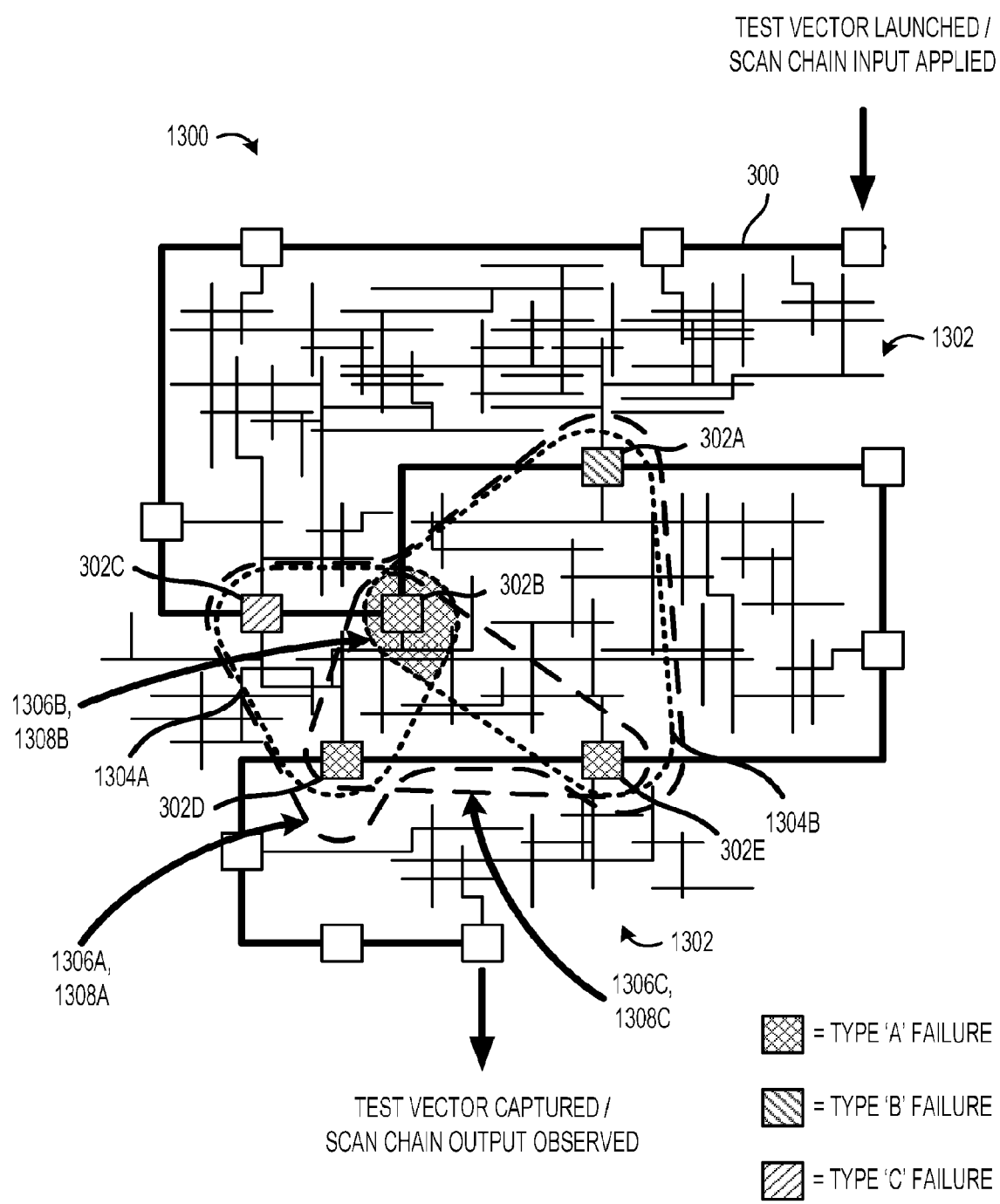
FIG. 13 schematically shows an embodiment of a physical layout for a semiconductor device, including example logic cones and suspect logical regions.

For example, FIG. 13 schematically shows an embodiment of a physical layout for a device 1300. As explained above, scan chains may be configured to provide test coverage to a predetermined portion of the semiconductor device. FIG. 13 depicts a scan chain arranged to provide test coverage to the region of device 1300 shown in FIG. 13. For simplicity, device 1300 includes a single scan chain 300 (depicted as a bold line joining a plurality of scan cells, the scan cells depicted as hollow boxes) electrically connected to multiple non-scan cells and interconnects (the non-scan cells and interconnects depicted as the thin lines through which scan chain 300 travels) and that are represented schematically as net 1302.

FIG. 13 also shows a plurality of logic cones (denoted as logic cones 1304A and 1304B). While the logic cones shown in FIG. 13 begin and end at the same scan chain, it will be understood that logic cones may receive input from one or more scan chains different from a scan chain receiving the output of the logic cone without departing from the scope of the present disclosure.

As shown in FIG. 13, scan chain 300 includes failing scan cells denoted individually as scan cells 302A-E and schematically shown as shaded boxes in FIG. 13, the shading varying depending on a failure frequency associated with the particular scan cell, which are electrically connected with logic cones 1304A and 1304B. Logic cones 1304A and 1304B have a union region 1306A and an overlap region 1306B (shown in crosshatch). Thus, in some embodiments, the suspect logical region may comprise the logical cells and interconnections within a physical region bounded by logic cones 1304A and 1304B (union region 1306A), while in some other embodiments, the suspect logical region may comprise the logical cells and interconnections within a physical region common to logic cones 1304A and 1304B (overlap region 1306B). It will be appreciated that the suspect logical regions shown by regions 1306A and 1306B are non-limiting examples, and that any suitable portion(s) of one or more logic cones (or net segments) may be used to define the suspect logical region without departing from the scope of the present disclosure.

Thus, the suspect logical region is defined with reference to the physical instantiations of the logical cells and interconnections electrically connected with the failing scan cells. Because a functional failure reported by a scan cell is likely to result from a defect in physical space observed by logic connected with the reporting scan cell, the suspect logical region may be used to identify device structures that surround or are physically proximate to the physical defect. Further, because the physical layout may have a different spatial appearance from the logical design, identifying the suspect logical region based on the physical representation may provide a user investigating the failure with a comparatively smaller region of the device relative to approaches based on the logical design alone.

In some embodiments, the suspect logical region may comprise a netlist including instance names for the logical cells and interconnections electrically connected with a failing scan cell or failing scan chain. For example, the suspect logical region may comprise a netlist for overlapping portions of logic cones electrically connected with a failing scan cell. Because the physical representation cross-references logical cell instance names with locations for the polygons that physically represent those logical cells (e.g., by comparison of polygon instance names from the physical representation with logical cell instance names in the netlist), in this example, the physical domain of the suspect logical region would comprise a region of the die including the physical instantiations of the logical cells and interconnects included in the netlist.

In some embodiments, the identity of and/or the scope of the suspect logical region may be defined and/or adjusted based on suitable failure characteristics for a scan chain and/or a scan cell. For example, in some embodiments, the scope of a suspect logical region may be adjusted according to a particular failure type. In the example shown in FIG. 13, scan cell 302A has a "type B" failure, scan cell 302C has a "type C" failure, and scan cells 302B, 302D, and 302E have a "type A" failure. As shown in FIG. 13, a suspect logical region (shown as region 1306C) associated with "type A" failures may be defined as the logical cells and interconnects electrically connected with scan cells having a "type A" failure. Any suitable failure type may be employed without departing from the scope of the present disclosure. Non-limiting examples of suitable failure types include opens, shorts, bridging failures, and timing (e.g., setup and hold) failures.

Additionally or alternatively, in some embodiments, the identity of and/or the scope of a suspect logical region may be defined and/or adjusted according to a predetermined scan cell failure frequency. For example, a threshold scan cell failure frequency may be set to have a value of 3, so that only scan cells reporting three or more failures may be included in the analysis described above. It will be appreciated that any suitable threshold scan cell failure frequency may be employed without departing from the scope of the present disclosure.

In some embodiments, a user may adjust the scope of the suspect logical region by suitable user input. For example, in some embodiments, a user viewing a graphical depiction of the physical layout of the suspect logical region may select portions of the suspect logical region for exclusion. Likewise, the user may select, via a suitable user interface, portions of logic connected to, but not included in, the suspect logical region for inclusion in the suspect logical region. Such adjustments may be made based on suitable failure characteristics associated with the suspect logical region like the failure characteristics disclosed above. While the example discussed above relates to a user interacting with a physical layout of the suspect logical region, it will be appreciated that, in some embodiments, a user may define suitable attributes and/or failure characteristics for refining the scope of the suspect logical region. Such characteristics may be referenced during a programmatic refinement of the suspect logical region performed by a suitable computing device, such as the failure analysis computing devices described elsewhere herein.

In some embodiments, adjustment of the scope of the suspect logical region may arise via simulation of the logical function within the suspect logical region. For example, in some embodiments, the scope of the suspect logical region may be reduced by simulating data flow in one or more logic cones included in the suspect logical region and comparing the simulated result with the observed electrical test mismatch. The results of such comparisons may identify portions of the suspect logical region that may be excluded from the candidate defect region.

Figure 14:
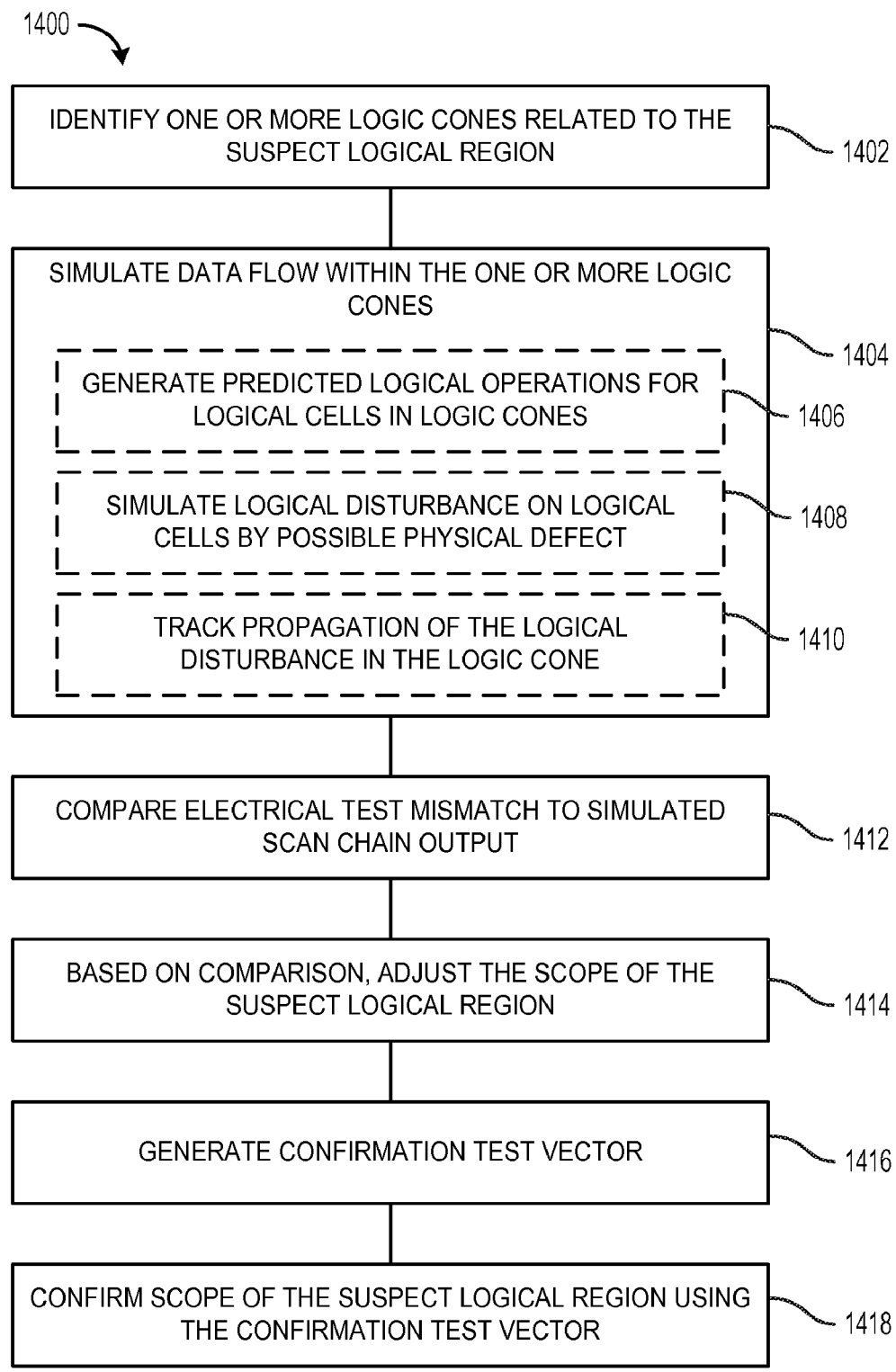
FIG. 14 shows a flow chart illustrating an embodiment of a method for adjusting the scope of the suspect logical region in response to a logical simulation of the suspect logical region.

For example, FIG. 14 shows a flow chart illustrating an embodiment of a method 1400 for adjusting the scope of the suspect logical region in response to a logical simulation of the suspect logical region. At 1402, method 1400 comprises identifying one or more logic cones related to the suspect logical region. For example, logic cones electrically connected to the scan chain for which the electrical test mismatch was reported may be identified at 1402.

At 1404, method 1400 comprises simulating data flow within the one or more logic cones included in the suspect logical region and electrically connected with the failing scan chain. Thus, in some embodiments, a netlist for a suspect logical region may be provided to a suitable logic simulator so that a logical design for the one or more logic cones included in the suspect logical region may be constructed. In some embodiments, simulating data flow within the one or more logic cones 1404 may comprise, at 1406, generating predicted logical operations for the logical cells included in each logic cone. Such predicted logical operations may be generated with reference to the logical cell information provided in a logical design file.

Simulating data flow within the one or more logic cones 1410 may further comprise, at 1408, simulating a logical disturbance on the logical cells by a physical defect; and, at 1410, tracking the propagation of the logical disturbance in the logic cone. Such simulation may occur programmatically by simulating logical disturbances based on information included within a failure file (e.g., based on functional failure type information) or based on predetermined heuristics (e.g., based on faults known to generate identical or similar failures, which may arise from a functional failure model generated during device design and/or device debug). Additionally or alternatively, in some embodiments, a user may select fault types for simulation. As the effect of the logical disturbance propagates through the logic cones, the logic cone output (i.e., the output provided to the failing scan cell at the end of the logic cone) flows into the scan chain, which may disturb the expected data flow within the scan chain and so that the simulated scan chain output manifests as a simulated scan chain mismatch.

Figure 15:
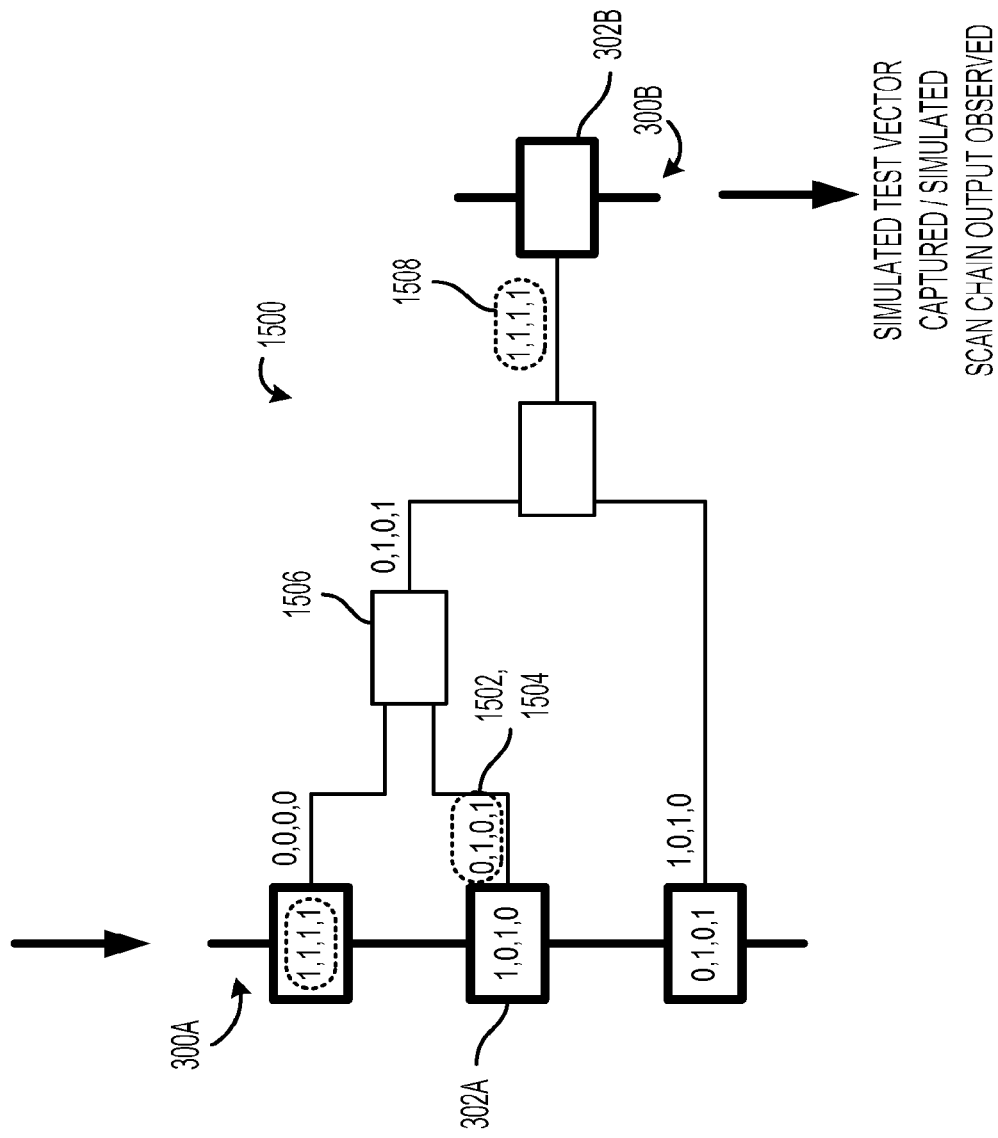
FIG. 15 schematically shows an embodiment of a physical layout for a non-defective logic cone.

For example, FIG. 15 schematically shows an embodiment of a physical layout for a non-defective logic cone 1500 electrically connected to scan chains 300A and 300B (shown with bold lines), a plurality of scan cells (shown as boxes having bold lines), and a plurality of non-scan cells (shown as boxes having thin lines). As shown in the simulation example depicted in FIG. 15, scan cell 302A has a value of "1, 0, 1, 0" that is transformed into an output 1504 having a value of "0, 1, 0, 1." Output 1504 becomes input 1502 fed into non-scan cell 1506, and continues to propagate through logic cone 1500. As the data propagates, the data is transformed according to the logical operations of the respective logical cells until the logic cone output 1508, having a value of "1, 1, 1, 1," is fed to scan cell 302B of scan chain 300B.

Accordingly, a physical defect at one electrically significant location in the logic cone may result in a particular logic cone output, and potentially in a particular scan chain output, that is different from a scan chain output resulting from a physical defect of another kind in the same location and/or from a physical defect at a different electrically significant location. Thus, by varying the type and location of one or more simulated physical defects within the suspect logical region and comparing the simulated output of one or more logic cones within the suspect logical region to the non-defective behavior of that logic (such as by comparing the simulated scan chain output with the expected scan chain output), it may be possible to identify portions of the suspect logical region that are more likely to have a defect than other regions. Put another way, the propagation of the logic cone output through a scan chain may be tracked for comparison with the observed electrical test mismatch. Thus, with reference to the embodiment shown in FIG. 14, method 1400 comprises, at 1412, for a particular logic cone of the suspect logical region, comparing the output of the scan chain in a simulated defective state to the observed electrical test mismatch, and, at 1414, adjusting the scope of the suspect logical region based on the comparison.

Figure 16:
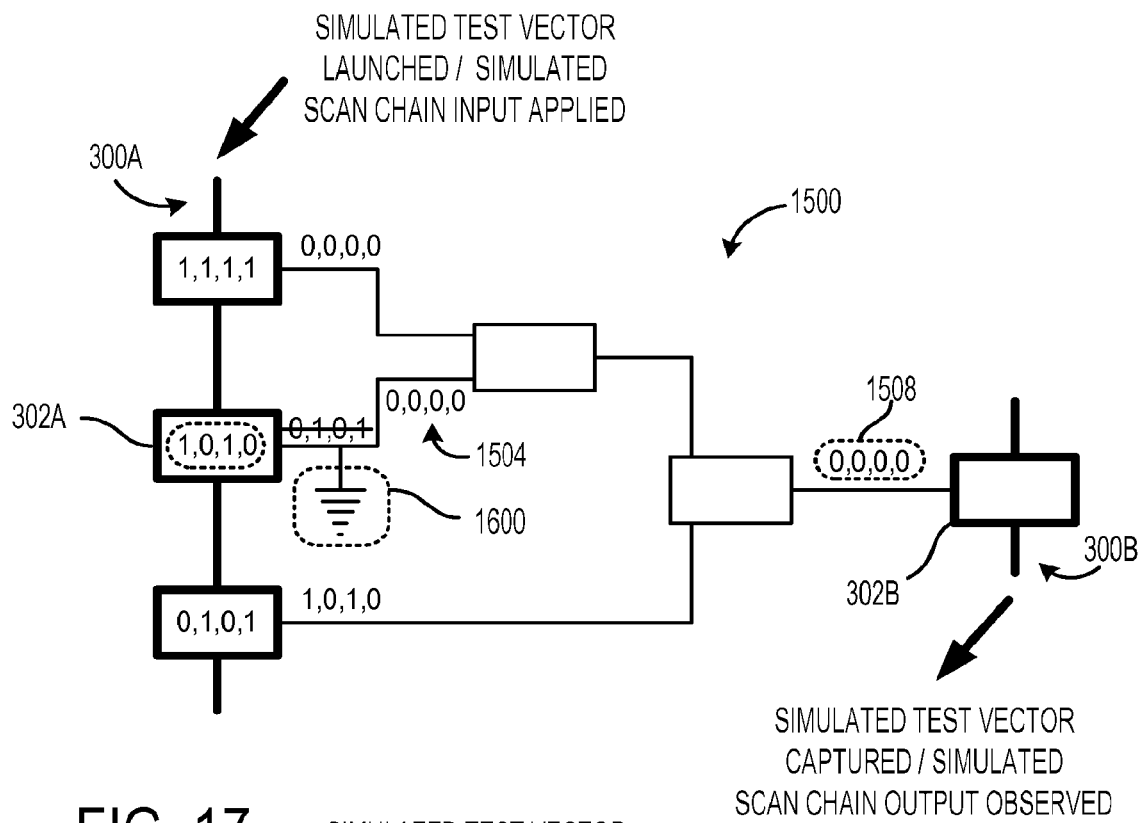
FIG. 16 schematically shows the logic cone of FIG. 15 altered to exhibit a ground short defect.
Figure 17:
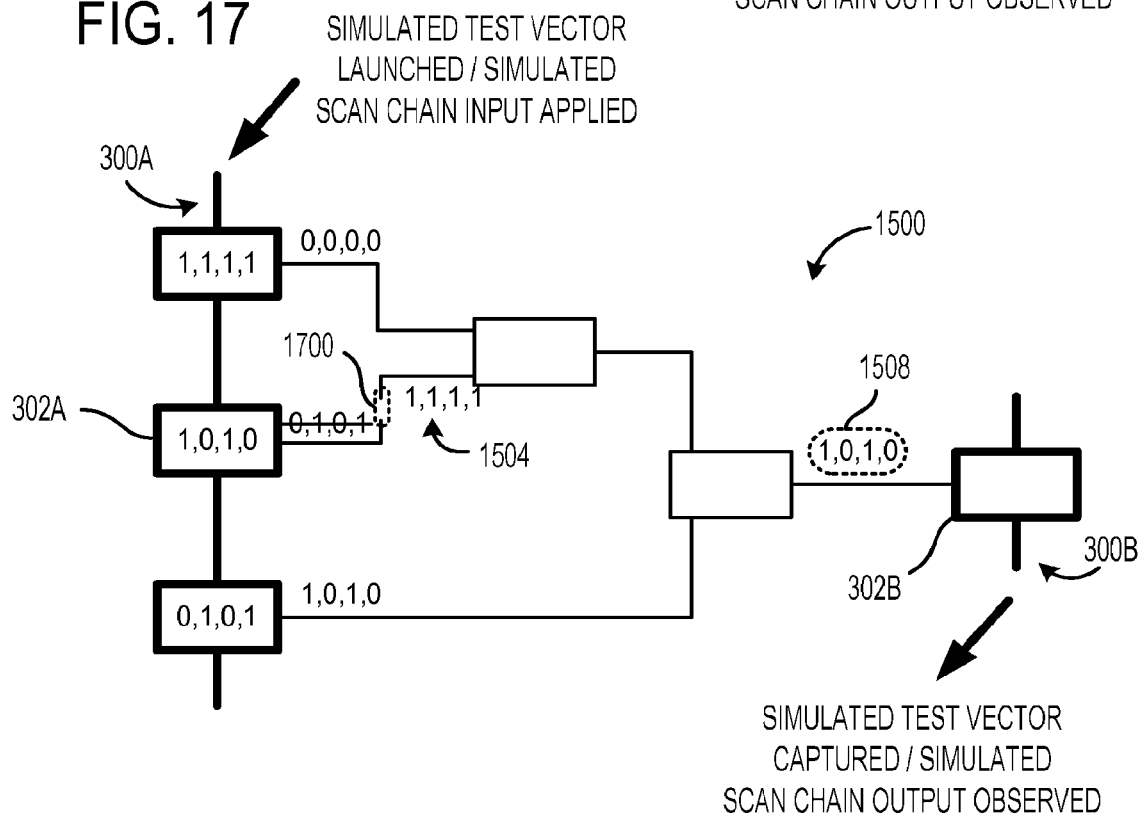
FIG. 17 schematically shows the logic cone of FIG. 15 altered to exhibit an open circuit defect.

For example, FIGS. 16-17 schematically show logic cone 1500 of FIG. 15 having different types of simulated physical defects (a short and an open, respectively) at the same location. FIG. 16 shows an example of predicted data flow through the embodiment of logic cone 1500 of FIG. 15 in response to a simulated test pattern applied to scan chain 300A. As with the example simulation depicted in FIG. 15, scan cell 302A in this example has a value of "1, 0, 1, 0." However, because FIG. 16 includes a simulated ground short defect 1600, the simulated logical cell output 1504 has a value of "0, 0, 0, 0" instead of "0, 1, 0, 1" (the expected non-defective simulated logical cell output 1504 of FIG. 15). The simulated data flow propagates through logic cone 1500 until it emerges as logic cone output 1508, having a value of "0, 0, 0, 0" (in contrast to the expected non-defective logic cone output 1508 of FIG. 15, which had a value of "1, 1, 1, 1") that is output to scan cell 302B of scan chain 300B.

The type of defect may also affect the data flow propagation within a logic cone and the logic cone output. For example, FIG. 17 shows an example of predicted data flow through the embodiment of logic cone 1500 of FIG. 15 in response to a simulated test pattern applied to scan chain 300A. As with the example simulation depicted in FIG. 15, scan cell 302A in this example has a value of "1, 0, 1, 0." However, the example shown in FIG. 17 includes a simulated open defect 1700 at the same location as simulated ground short defect 1600 of FIG. 16. As a consequence, simulated logical cell output 1504 has a value of "1, 1, 1, 1," in contrast to the expected non-defective simulated logical cell output 1504 of FIG. 15 ("0, 1, 0, 1") and the logical cell output 1504 for a simulated ground short defect shown in FIG. 16 ("0, 0, 0, 0"). Further, the effect of open defect 1700 propagates through logic cone 1500, so that the simulated logic cone output 1508 output to scan cell 302B of scan chain 300B has a value of "1, 0, 1, 0" in contrast to the expected non-defective simulated logic cone output 1508 of FIG. 15 ("1, 1, 1, 1") and the logic cone output 1508 for a simulated ground short defect shown in FIG. 16 ("0, 0, 0, 0"). While the examples shown in FIGS. 16-17 illustrate the variation in simulated logic cone output 1508 from differing types of physical defects at the same electrically significant location in the physical layout, it will be appreciated that varying the location of the simulated defect may lead to different values for simulated logic cone outputs and potentially different values for the simulated scan chain output.

As explained above, the scope of the suspect logical region may be adjusted based on a comparison of the observed electrical test mismatch to the simulation result. For example, in some embodiments, comparison of the electrical test mismatch to one or more simulated logic cone outputs may identify one or more logic cones for exclusion from the suspect logical region based on inconsistencies between the simulated and observed scan chain output. Additionally or alternatively, such comparisons may identify one or more logic cones that are logically unaffected by a physical defect, allowing those logic cones to be excluded from the suspect logical region. Thus, the scope of the suspect logical region may be adjusted to include the logical cells and interconnects for which the simulated logic cone output generates simulated scan chain output that matches the electrical test mismatch.

In some embodiments, the result of the logical simulation may be used as a basis for a test vector configured to confirm that the defect causing the electrical test mismatch is included within the scope of the suspect logical region. Put another way, a new test vector may be constructed and fed to the device by a test unit, and the test output observed. Based on the observed test output, it may be determined whether the logical simulation of the suspect logical region accurately simulates the behavior of the actual semiconductor device. Thus, in some embodiments, method 1400 may comprise, at 1416, generating a confirmation test vector, and, at 1418, confirming the scope of the suspect logical region using the confirmation test vector by supplying the confirmation test vector to the semiconductor device and observing the response of the scan chain to the confirmation test vector.

For example, in some embodiments, a confirmation test vector may include one or more confirmation test input values configured to generate the expected test output value for a non-defective device. In such embodiments, a match between the expected test output value and the observed test output value may confirm that the logical simulation accurately identified the logical cells and/or interconnections affected by the physical defect, and that the suspect logical region has a scope suitable to detect the defect. This confirmation, in combination with the physical information for those logical cells and/or interconnections included in the physical representation, may provide the user with an approximate physical location or a physical region for the physical defect.

For example, in some embodiments, generating a confirmation test vector may include generating a simulated scan chain output by simulating a plurality of logical disturbances within the logic cones, each logical disturbance configured to emulate a fault caused by a physical defect at a select physical location within the suspect logical region as described above. For each logical disturbance, the simulated scan chain output may be collected and/or tracked. Based on the collected simulated scan chain output, one or more confirmation test input values configured to distinguish one particular logical disturbance as accurately emulating the logical behavior of the semiconductor device may be selected. The selected confirmation test input values would form the basis of the confirmation test vector. The confirmation test vector may then be supplied to the semiconductor device using suitable electrical test hardware and/or software. The result of the confirmation test (i.e., how the scan chain responded to the confirmation test) may be observed and recorded as confirmation test output. Examination of the confirmation test output may identify where the logical disturbance is (e.g., a physical defect location or region) and/or what type of physical defect is causing the logical disturbance. The scope of the suspect logical region and/or the candidate defect region may be adjusted accordingly, and the result displayed to the user.

It will be understood that any suitable confirmation test input values may be used without departing from the scope of the present disclosure. For example, because a single simulation may generate a non-unique logic cone output, in some embodiments, a plurality of confirmation test input values may be configured to resolve conflicting physical location information for the defect.

Turning back to FIG. 2, method 200 comprises, at 208, generating a candidate defect region based on the suspect logical region. The candidate defect region is a region of the device that is likely to include the physical defect causing the electrical test mismatch. The candidate defect region is defined by physical coordinates that correspond to the physical perimeter of the suspect logical region. Thus, with reference to the example suspect logical regions shown in FIG. 13, the candidate defect region may be defined by the perimeter of union region 1306A (denoted as candidate defect region 1308A), overlap region 1306B (denoted as candidate defect region 1308B), or region 1306C (denoted as candidate defect region 1308C) depending on how the scope of the suspect logical region is defined and/or adjusted.

Because many semiconductor devices have three-dimensional architecture, in some embodiments, the candidate defect region may include two or more layers of the device. Further, in some embodiments, the candidate defect region may be smaller than the suspect logical region. For example, the suspect logical region may include, within its physical boundaries, electrically insignificant regions (i.e., regions of physical space in the device that, if a defect were present, would cause electrical or performance consequences within an acceptable tolerance). Such electrically insignificant regions may be included in the physical representation, by definition, by comparison of the physical layout with a user-configurable rule, or by reference to any other suitable parameter.

At 210, method 200 comprises, displaying the candidate defect region, the physical layout, and/or the suspect logical region. Such displays may lead a user to a location or region of the device for physical investigation. It will be appreciated that suitable displays of the physical region, physical layout, and/or the suspect logical region may be generated and updated as refinements and adjustments are made to the suspect logical region, and that such displays may be used interactively by a user via a suitable user interface (described in more detail below). Thus, the user may interact with various elements of the display to select and deselect various logical cells, interconnections, logic cones, and suspect logical regions while diagnosing and locating the physical defect. Further, it will be understood that the results of various logical simulations may be displayed to the user so that the user may vary and adjust the simulations during fault diagnosis and location determination.

Figure 18:
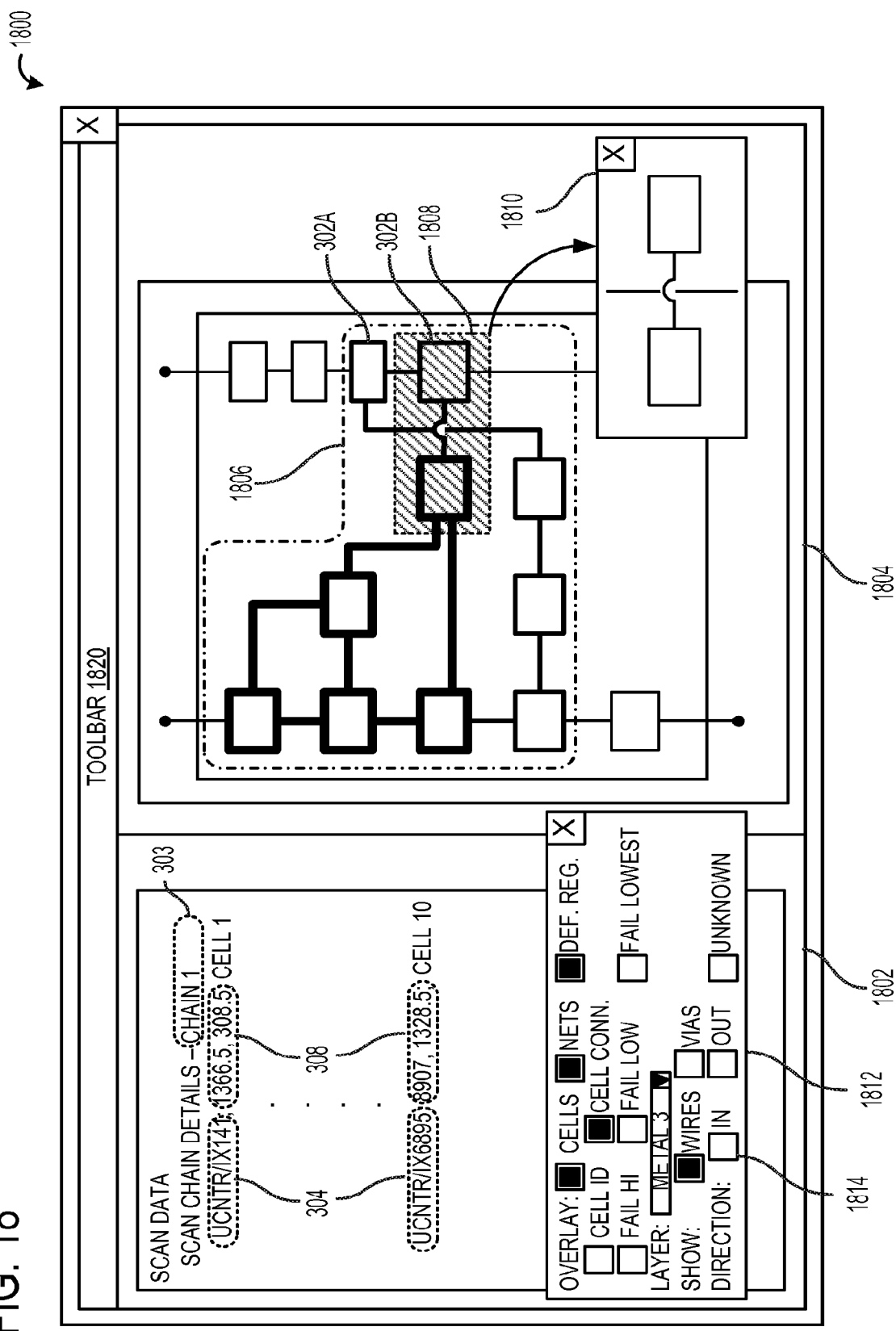
FIG. 18 schematically shows an embodiment of a graphical user interface.

For example, FIG. 18 schematically shows an embodiment of an example graphical user interface 1800 including a plurality of display regions. In the example shown in FIG. 18, a portion of the physical representation is shown in display region 1802. For example, display region 1802 shows various logical cell instance names 304 for particular scan cells included in a particular scan chain (identified by scan chain instance name 303) matched with physical location information 308 for each particular scan cell. FIG. 18 also depicts a portion of the physical layout of the device in display region 1804. Display region 1804 also shows an overlay of a suspect logical region 1806 formed from by logic cones electrically connected to two failing scan cells (depicted as scan cells 302A and 302B in FIG. 18) and an overlay of a candidate defect region 1808. Such overlay displays may provide a visual indication of synergistic and/or parasitic effects among net elements to a user, who may elect to add or subtract logical cells from the suspect logical region and/or the candidate defect region. It will be appreciated that other suitable display features may be included in one or more display regions for displaying physical layout information and/or logical design information. For example, FIG. 18 depicts a display region 1810 showing a closer view of candidate defect region 1808.

FIG. 18 shows a display region 1812 including control elements 1814 configured to provide control and adjustment of the images displayed at graphical user interface 1800 and/or control various logical simulation functions (not shown). For example, a user interaction with one or more control elements 1814 may cause a display change within a display region. Thus, in one scenario, user action to toggle to or select a particular scan chain may highlight a visual representation of that particular scan chain in a display of the physical layout. Additionally or alternatively, user interaction with control elements 1814 may alter a composition of the suspect logical region and/or the candidate defect region. Thus, in one example, user selection of a specific scan chain may act to include the specific scan chain in the suspect logical region. Non-limiting examples of control elements 1814 include overlay display selection elements, device layer display selection elements, interconnect and via display selection elements, and logic and data flow direction selection elements.

In some embodiments, displaying one or more of the candidate defect region, the physical layout, and the suspect logical region may include varying a visual appearance of the display according to a device failure characteristic. For example, a visual appearance of one or more logical cells included in the suspect logical region may be varied according to one or more of a mismatch frequency for the failing scan chains, according to a physical proximity of two or more logical cells electrically connected to the failing scan chains, or according to any other suitable failure characteristic. In such embodiments, varying the visual appearance of the display may include varying one or more of a color, a brightness, a line intensity, and a font size. In the example shown in FIG. 18, a variation in line intensity is used to identify, on a physical layout of the device, portions of the device that experience different failure frequencies.

The example graphical user interface 1800 shown in FIG. 18 includes a toolbar 1820. Toolbar 1820 may include toolbar elements (not shown) that provide a user with control of the display and/or various logical simulation functions. For example, toolbar elements may be provided that allow a user to drag and drop elements; resize one or more display regions; provide search functions for logical cells; access bookmarking functionality for various logical cells and/or nets; access failure logs; selectively view elements of the physical representation, the physical layout, the suspect logical region, and/or the candidate defect region; build and execute scripts and routines; check and report LEF and DEF files for errors; and otherwise interact with the data and the data presentation.

Figure 19:
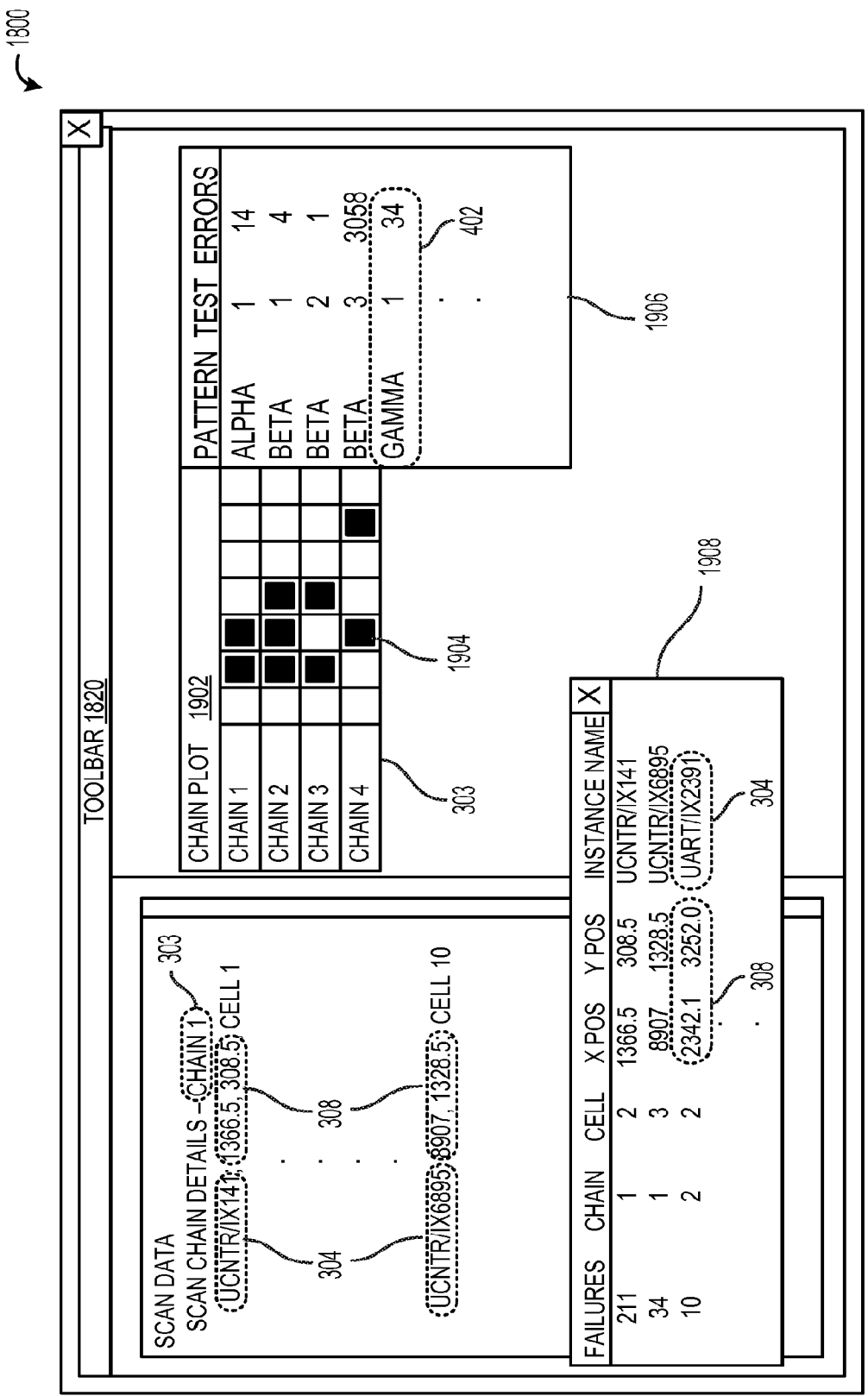
FIG. 19 schematically shows an embodiment of another graphical user interface.

FIG. 19 schematically shows an embodiment of another example of graphical user interface 1800. As shown in the example of FIG. 19, graphical user interface 1800 includes a scan chain plot display region 1902 that displays information about various failing scan chains. In the example shown in FIG. 19, chain plot display region 1902 includes visual indicators 1904 that call attention to failing scan cells. The appearance (e.g., color, shading, size, etc.) of visual indicators 1904 may be adjusted according to failure type and/or frequency so that a user may detect differences in failure severity among the various failing scan cells. In the example shown in FIG. 19, graphical user interface 1800 also includes a test information display region 1906 configured to display test pattern information and a failing scan cell display region 1908 configured to display failure frequency and physical location information for failing scan cells.

The candidate physical defect location may help a user diagnose and image the physical defect responsible for the functional failure of the device. However, in some embodiments, a physical defect detected during manufacturing by a suitable defect metrology tool may be used in conjunction with information included in the physical representation to determine whether the defect has the potential to harm the device.

For example, in some embodiments, portions of the physical representation, such as portions corresponding to electrically significant regions of the device, may be sent to a suitable defect metrology system. In turn, the defect metrology system may identify whether a defect detected on a device substrate surface during manufacturing may potentially harm the device. The defect metrology system may also identify specific portions of the device that may be affected by the detected defect and flag a user for follow-up, such as a manufacturing re-work process or electrical test and/or sort follow-up. Examples of such interaction between the failure analysis systems described herein and defect metrology systems are described in more detail below.

In some embodiments, portions of the physical representation may be provided to a defect metrology system. Providing the physical representation may permit the defect metrology system to reference, via the physical representation, the logical and electrical significance of a physical location on a device being scanned in a defect metrology tool. As explained above, electrically significant regions are physical regions of the device where a physical defect may degrade or disable device functionality. In some embodiments, an electrically significant region may be defined as a region of the physical layout of the device where test coverage exceeds a predetermined test coverage threshold (e.g., greater than 98% test coverage in one non-limiting example). Additionally or alternatively, in some embodiments, an electrically significant region may be defined as a region of the physical device including a density of scan chains and/or scan cells that exceeds a predetermined scan structure density. Because defects occurring in electrically significant regions may have a comparatively greater effect on device performance relative to defects occurring at electrically insignificant regions, identifying defects in electrically significant regions during manufacturing may provide the manufacturer with the opportunity to take remedial steps to mitigate damage caused by the defect or to scrap the wafer if remediation is not proper. For example, if a serious defect is detected in an electrically significant region of the device, the defective wafer may be scrapped in-line, instead of during test. Thus, the manufacturer may be able to quickly replace the lost inventory by starting a new wafer. Further, if a defect is detected in-line and found not to be in an electrically significant region, the manufacturer may choose to continue processing the wafer. Should the wafer yield functional devices, the manufacturer may have avoided the loss associated with scrapping the wafer.

Figure 20:
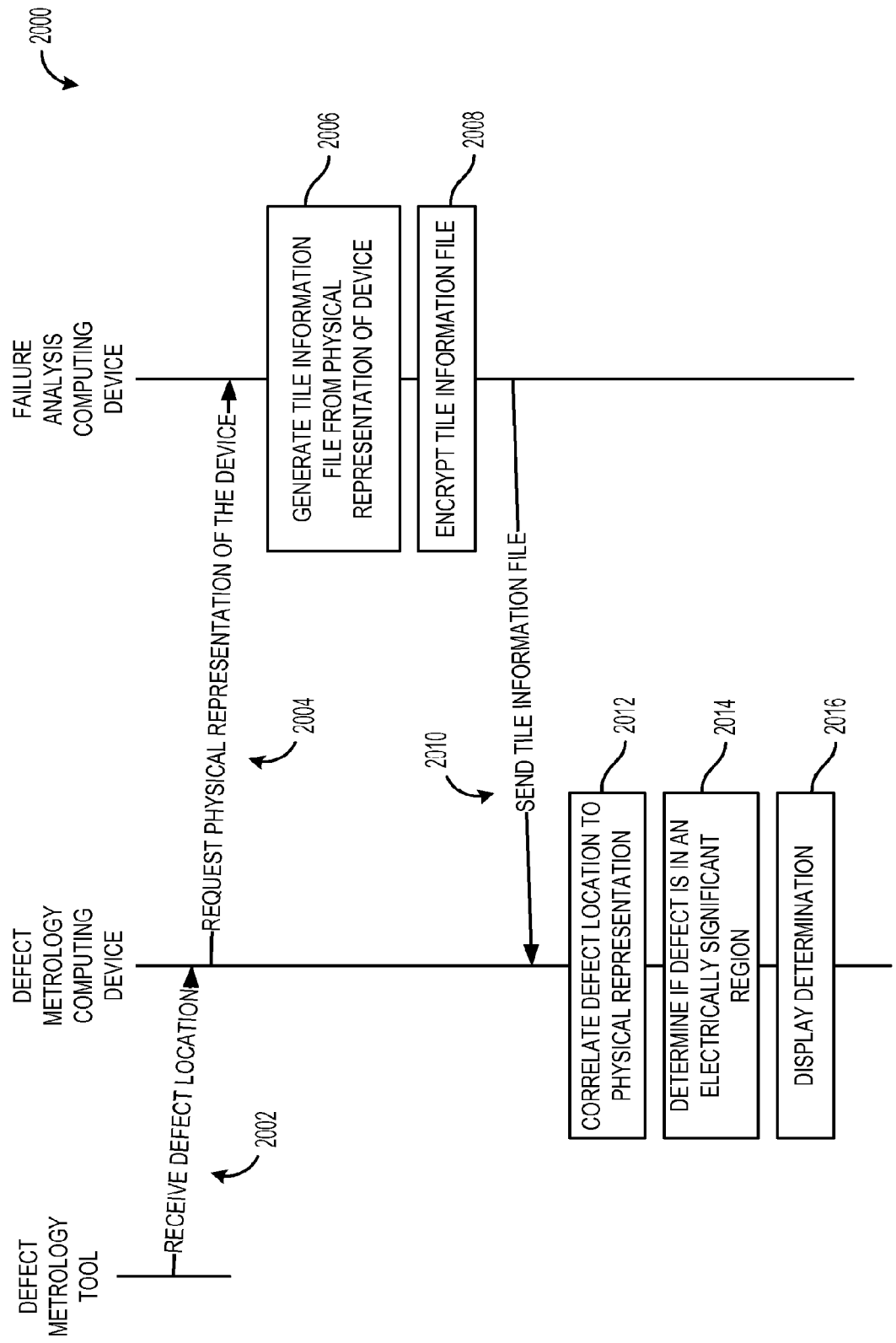
FIG. 20 shows a flow chart illustrating an embodiment of a method for correlating a defect location detected by a defect metrology tool to an electrical significance of a semiconductor device.

FIG. 20 shows a flow chart for an embodiment of a method 2000 for correlating a defect location to an electrical significance of a semiconductor device at a defect analysis module of a suitable defect metrology computing device. As shown in FIG. 20, method 2000 includes, at 2002, receiving a defect location on a device substrate from a defect metrology tool. One or more defect metrology tools (such as suitable bright-field tools and/or suitable dark-field tools) collect defect data from the surfaces of device substrates. The defect metrology tool identifies the defect location when a defect is identified. In some embodiments, the defect location is recorded by a coordinate location on the substrate surface.

In some embodiments, the defect metrology tool may also classify the defect by one or more suitable classifiers (e.g., defect size, defect type, etc.) programmatically or in response to a user input. Additionally or alternatively, in some embodiments, the defect metrology tool may collect an image of a region of the device substrate including the defect. Such images are typically referred to as "clippings." Non-limiting example minor dimensions for a clipping may range from 0.5 micron to 5 micron. These clippings and classifications may be associated with the defect location and received by the defect metrology computing device along with the defect location.

At 2004, method 2000 includes, at the defect metrology computing device, requesting the physical representation of the device. For example, in some embodiments, the physical representation may be an embodiment similar to the physical representation shown in FIG. 12, though it will be understood that any suitable physical representation may be received without departing from the scope of the present disclosure. In some embodiments, the physical representation may include suitable physical layout and logical design information. Non-limiting examples of such information include logical cell instance names, polygon instance names, polygon location information, logical cell operations, and location and/or identifying information for various interconnections.

Because the physical representation of some devices may have a large size, in some embodiments, the defect metrology computing device may request only a portion of the physical representation. This may reduce network traffic and/or computational overhead. Accordingly, in some embodiments, the defect metrology computing device may request a portion of the physical representation for the physical region of the device in which a defect was detected. In some embodiments, the size and shape of the clipping may be related to the portion of the physical representation that is requested. For example, in a scenario where the clipping size is a 5 micron.times.5 micron square image of the device substrate, the request may be for a portion of the physical representation physically corresponding to the clipping size, shape, and/or location.

In response, at 2006 the failure analysis computing device generates a tile information file generated in part on the portion of the physical representation requested. For example, in embodiments where the defect metrology computing device requests a portion of the physical representation, the tile information file may include portions of the requested physical representation corresponding to the request. In one scenario, on receipt of the request for a particular portion of the physical representation corresponding to a clipping, the failure analysis computing device may divide the physical layout into tiles.

In one non-limiting example, the physical layout may be divided into tiles having a size and shape equivalent to the size and shape of the clipping corresponding to the request. A particular tile having a physical location on the semiconductor device corresponding to the defect location may then be selected as the basis for generating the requested physical representation. The requested physical representation may be generated according to the various processes described herein. For example, for the particular tile, the failure analysis computing device may match polygons included in the physical layout with logical cells included in the logical design. The requested physical representation may then be transmitted to the defect metrology computing device. Accordingly, in a scenario where the clipping size is a 5 micron.times.5 micron square image of the device substrate, the failure analysis computing device may divide the physical layout into 5 micron.times.5 micron square tiles. The failure analysis computing device may then select the tile or tiles that correspond to the physical region of the device substrate sampled by the clipping, generate the physical representation for the particular tile, and send the physical representation to the defect metrology computing device. In some embodiments, the requested physical representation may be sent in a tile information file.

In some embodiments, the tile information file may also include tile location coordinates that may be configured to allow a particular tile to be matched to a particular clipping, a tile identifier, and/or an electrical significance identifier configured to indicate a relative electrical significance of the tile. For example, an electrical significance identifier may include an indication of whether the tile may be indicated as including one or more electrically significant or electrically insignificant regions (e.g., as a region including more or less test circuit coverage than a preselected threshold test circuit coverage, respectively), an indication of a particular historical failure rate and/or failure type during electrical testing, an indication of historical physical defect inclusion rates and/or historical physical defect types observed within the tile, etc.

It will be understood that a single tile may include the portions of the physical representation that describe one or more layers of the device. Thus, in one scenario, a tile may include the physical representation for a 5 micron.times.5 micron section of a single layer (for example, a gate layer) corresponding to the physical portion of the device substrate included in the clipping. In a second scenario, a tile may include the portions of the physical representation corresponding to a 5 micron.times.5 micron section of a layer stack corresponding to the physical portion of the device substrate included in the clipping, the layer stack including a plurality of selected layers (e.g., metal layers 1 through 3, metal layers 2 through 7, etc.).

Because the device designer and the device manufacturer may be different entities, in some embodiments, method 2000 may comprise, at 2008, encrypting the tile information file. Thus, the physical representation may be provided in an encrypted form configured to secure the design information (e.g., the logical design) while providing a reference to the physical layout. For example, in some embodiments, the tile location coordinates may be scrambled to conceal the physical location for the tile. Thus, in one scenario, a tile positioned at coordinates (1,1) may be encrypted as (9,7) prior to transmission to the defect metrology computing device. Upon receipt of the tile information file, the defect metrology computing device may decrypt (9,7) as coordinates (1,1) using an appropriate decryption key. This may comparatively reduce encryption/decryption computing overhead while protecting access to tile information. It will be understood that any suitable encryption/decryption scheme may be employed, for information included in the tile information file or for the tile information file itself, without departing from the scope of the present disclosure. Further, it will be appreciated that, in some embodiments, various trust levels may be established so that comparatively more trusted users may have comparatively greater access to more sensitive logical design information. Thus, in one example, an encrypted tile information file may include elements of the logical design for each tile that are only available to the most trusted users.

At 2010, the failure analysis computing device sends the tile information file to the defect metrology computing device. Once the defect metrology computing device receives the tile information file (and decrypts the file if the file is encrypted), method 2000 includes, at 2012, correlating the defect location to the physical representation by comparing the coordinates for the defect location to the coordinates of the various physical layout structures (e.g., polygons) and interconnections included in the physical representation.

For example, in one scenario, the defect metrology computing device may determine whether a small particle defect is located on top of a gate structure by comparing the coordinates for the physical layout of the gate structure included in the physical representation to the defect coordinates. In some embodiments, correlating the defect location may include comparing the defect coordinates to polygon and interconnection locations in the same layer as the defect scan layer (i.e., the substrate layer on which the defect was detected) and/or comparing the defect coordinates to polygon and interconnection locations in other layers.

At 2014, method 2000 includes generating a significance determination judging whether the defect is in an electrically significant region. The defect location and/or the significance determination may then be stored in a suitable defect metrology database. The information included in the database may be referenced by a user when determining whether a defect on a substrate may be reworked or whether the substrate is unrecoverable.

In some embodiments, a determination of the electrical significance of a defect may be generated using the coordinate-level correlation described above. Additionally or alternatively, in some embodiments, generating the significance determination may include determining if the defect is within a predetermined threshold distance of a physical structure (e.g., a polygon) and/or a physical interconnection. If the defect is within the threshold distance, the defect may be judged to be in an electrically significant region.

Because a defect may be detected in an electrically insignificant region in one substrate layer, yet may physically disrupt the deposition and patterning of an electrically significant region of a subsequent substrate layer, in some embodiments, the threshold distance may be checked with reference to structures in layers above and/or below the layer at which the defect was detected. Thus, in some embodiments, the determination of whether the defect is in an electrically significant region may include checking whether the defect is on top of, and/or will be overlaid by, an electrically significant structure or interconnection of another layer.

For example, FIG. 21A schematically shows an embodiment of a clipping 2100 for an Nth-layer of a semiconductor device. In the example shown in FIG. 21A, clipping 2100 includes a plurality of structures 2104 patterned on substrate 2102. Also shown in FIG. 21A is a box 2108A defining an electrically significant region within the N-th layer. A defect 2106 bridges two adjacent structures 2104. However, because defect 2106 does not overlap box 2108A, defect 2106 would be judged as existing within an electrically insignificant region of the Nth-layer. FIG. 21B schematically shows electrically significant regions for the (N+1)th-layer of the device illustrated in the embodiment of FIG. 21A. As shown in FIG. 21B, defect 2106 overlaps box 2108B, so that defect 2106 would be judged as within an electrically significant region of the (N+1)th-layer. By alerting the user to the potentially harmful nature of defect 2106 to a subsequent layer, the user may take action to clean, rework, or scrap the substrate prior to depositing and patterning the (N+1)th-layer. It will be appreciated that other suitable parameters may be included when determining whether a defect lies within an electrically significant region. For example, defect size, type, and composition may be considered in some embodiments. Additionally or alternatively, in some embodiments, layer thickness and layer type of the instant, previous, and/or subsequent layers may be considered when evaluating whether the defect is in an electrically significant region.

At 2016, method 2000 comprises displaying the significance determination of whether the defect is in an electrically significant region or not. In some embodiments, the display may depict different representations of the significance determination based on a trust level of the user. For example, in some embodiments, the defect metrology computing device may display a warning to a user having a comparatively lower level of trust that the defect is in an electrically significant region without providing further information about the physical representation and/or the logical design of the device to that user. In contrast, a user possessing a comparatively higher level of trust may be presented with more sensitive or more detailed logical design information. For example, displaying the significance determination may include displaying an overlay of a graphical representation of one or more of the defect location and an image of the defect with a graphical representation of one or more of a portion of the physical layout and an electrically significant region within the portion of the physical layout. Thus, the defect metrology computing device may shield sensitive logical design information from a manufacturer while providing the manufacturer with suitable information to take action in response to the defect.

It will be appreciated that the operations described above may be performed in any suitable order and/or by any suitable computing device. In some embodiments, portions of the significance determination may be performed by the failure analysis computing device. For example, the failure analysis computing device may determine which portions of the physical layout are electrically significant (e.g., according to predetermined rules, such as test coverage rules related to scan cell location, proximity, and/or density) and include an indication of the electrical significance of those portions in a file (such as the tile information file described above) to the defect metrology computing device. The defect metrology computing device may then display the electrical significance indication to a user.

As explained above, the physical defect location, whether detected in-line by a defect metrology tool or identified by a suitable failure analysis technique after electrical test, may help a user diagnose and locate a physical defect responsible for a functional failure of the device. Because the physical causes for such defects may result from systemic failures, such as processing tool excursions and/or, process operation integration marginalities, in some cases, the candidate defect region may be fed back to the fabrication operation, such as to a defect metrology system used in the fabrication process. Further, in some embodiments, the candidate defect region may be provided to EDA tools to refine future steppings of the physical layout for the device.

For example, in some embodiments, once identified by a suitable method (for example, such as by the embodiment shown in FIG. 2), the candidate defect region and/or other portions of the physical representation may be provided to a defect metrology system for correlation with manufacturing process data. Example manufacturing process data may include defect data from defect metrology tools and/or statistical process data from various process tools (e.g. etchers, steppers, furnaces, etc.). This may allow a user to identify marginal process operations or equipment.

Figure 22:
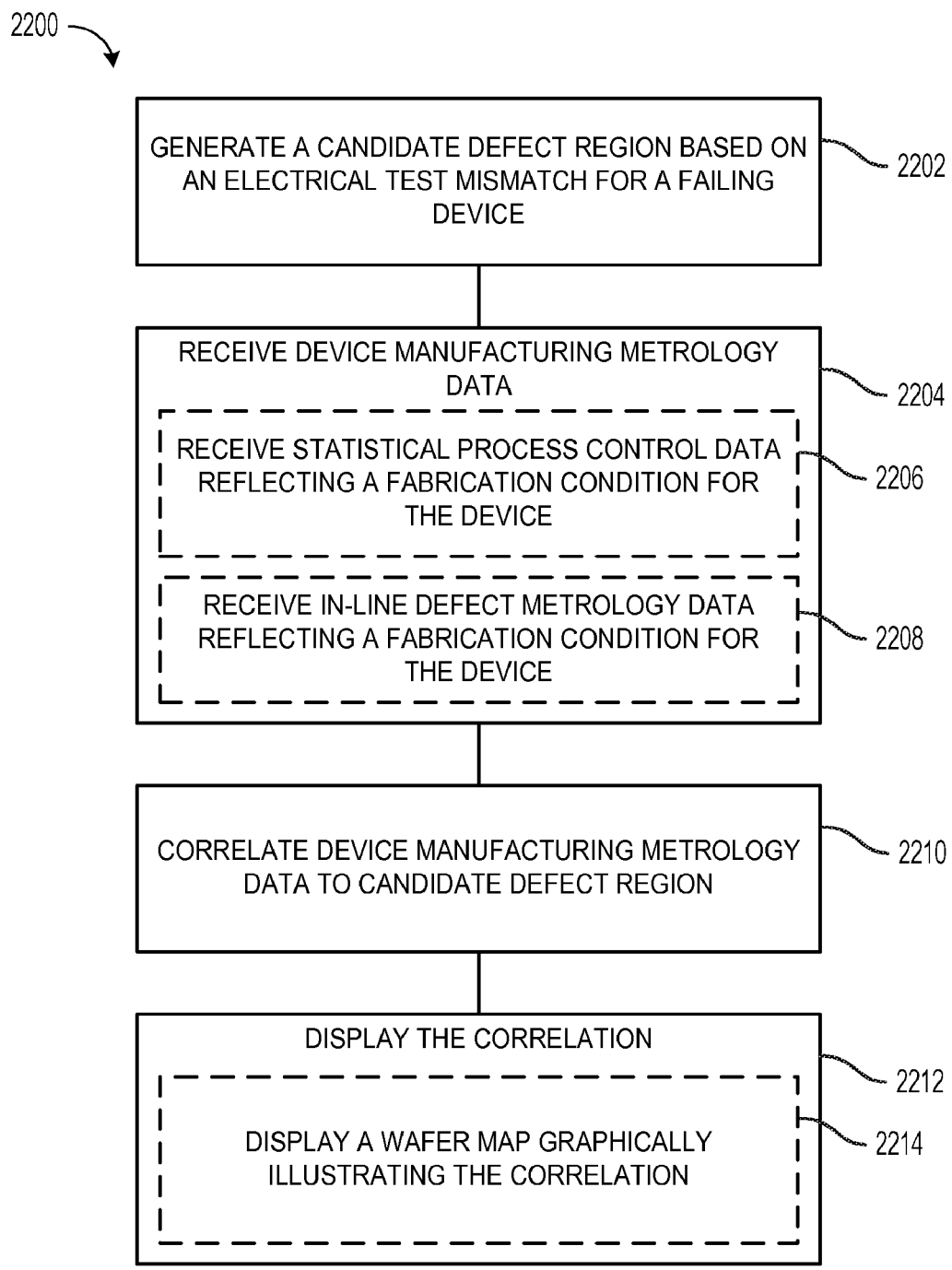
FIG. 22 shows a flow chart illustrating an embodiment of a method for correlating a physical candidate defect region with device manufacturing metrology data.

FIG. 22 shows a flow chart for an embodiment of a method 2200 of correlating a candidate defect region for a failing semiconductor device with device manufacturing metrology data for a device manufacturing process used to fabricate the failing semiconductor device. Method 2200 comprises, at 2202, generating a candidate defect region based on an electrical test mismatch for the semiconductor device. For example, the candidate defect region may be generated according to an embodiment of method 200.

At 2204, method 2200 includes receiving the device manufacturing metrology data. Device manufacturing metrology data may be received in any suitable form. For example, device manufacturing metrology data may be included in a metrology data file downloaded from a remote server, a cloud environment, or a defect or manufacturing process tool. In some embodiments, receiving the device manufacturing metrology data may comprise, at 2206, receiving statistical process control data reflecting a fabrication condition (e.g., a processing tool identifier, a processing event identifier, or a processing condition associated with the failing semiconductor device). In some embodiments, receiving the device manufacturing metrology data may include at 2208, receiving in-line defect metrology data for the device manufacturing process reflecting a fabrication condition for the failing device. (e.g., a defect count for a device substrate associated with the failing device or a defect count for a tool monitoring substrate associated with a tool that processed the device substrate).

Next, at 2210, method 2200 comprises generating a correlation between the device manufacturing metrology data and the candidate defect region. The correlation may be based on any suitable parameters. For example, a correlation between two or more processing tool identifiers, processing conditions, and processing events associated with fabricating a device structure located within the candidate defect region may be generated. By correlating the candidate defect region of the failing device to suitable wafer, processing tool, and manufacturing process parameters, it may be possible to identify a root cause for the physical defect. In some embodiments, correlating the manufacturing data to the candidate defect region may include building a suitable correlation table including a plurality of correlation parameters and identifying one or more processing tools that processed the particular failing device along with other devices (e.g., tested devices exhibiting the same failure mode and/or candidate defect region, devices on substrates still in process, and/or finished but untested devices).

Non-limiting examples of suitable correlation parameters include wafer-level or die-level physical location coordinates associated with the candidate defect region, electrical test mismatch information, wafer lot identification information associated with a wafer lot from which the defective device originated, wafer identification information associated with a wafer from which the defective device originated, operation identification information associated with a metrology or processing operation, time and date information, and processing and/or metrology equipment identification information.

Figure 23:
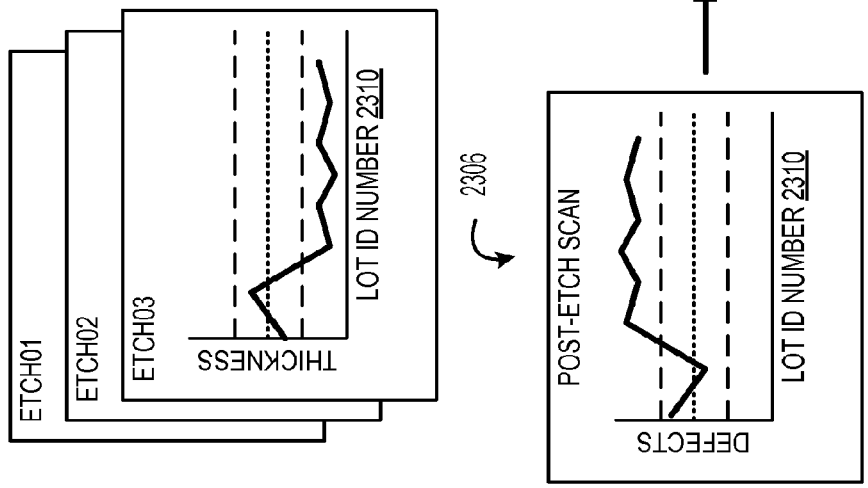
FIG. 23 schematically shows an embodiment of a correlation table generated based on device manufacturing metrology data and a physical candidate defect region.

For example, FIG. 23 schematically shows an embodiment of a correlation table 2300 based on device manufacturing metrology data 2302 and candidate defect region 2316. In the example shown in FIG. 23, correlation table 2300 comprises device information, including lot identifier 2310, wafer identifier 2312, and die identifier 2314. One or more candidate defect regions 2316 are also included in correlation table 2300.

Correlation table 2300 also comprises device manufacturing metrology data 2302 includes statistical process control data 2304 for the device manufacturing process and in-line defect metrology data 2306 for the device manufacturing process. It will be appreciated that other suitable data, such as electrical test information, may also be included in device manufacturing metrology data 2302. For example, in some embodiments, historic electrical test information and/or candidate defect region information for other devices may be included in correlation table 2300.

In the example shown in FIG. 23, statistical process control data 2304 is depicted as a plurality of thickness measurements taken from device product lots associated with etch process tools. For example, statistical process control data 2304 may include, in some embodiments, tool identification information 2324 that identifies a particular processing tool, tool defect data 2326 that includes monitoring data for defect generation levels at a processing tool, and tool process parameter data 2328 that tracks one or more tool processing parameters (for example, thickness).

Further, the example shown in FIG. 23, in-line defect metrology data 2306 is illustrated as defect scan measurements taken from the same device product lots. In the example shown in FIG. 23, in-line defect metrology data 2306 includes process step identification information 2318 that identifies a process step associated with the in-line defect measurement, defect count information 2320 that may include a count of particles or other defects detected by the in-line defect metrology tool, and defect location information 2322 that may include coordinates for the various defects detected at the in-line metrology tool. However, it will be appreciated that any suitable device manufacturing metrology data 2302 may be employed without departing from the scope of the present disclosure.

Turning back to FIG. 22, at 2212, method 2200 comprises displaying a portion of the correlation to a user. Displaying the correlation may include displaying a portion of the correlation table, displaying the identities of processing tools at which the failing device was processed, displaying the identities of other failing and/or viable devices processed by those processing tools, etc.

Additionally or alternatively, in some embodiments, displaying the correlation may include displaying one or more of a portion of each of the physical layout, the suspect logical region, and the candidate defect region with the device manufacturing metrology data. In one example, a portion of a bright-field in-line defect scan may be overlaid with the candidate defect region and/or the physical representation. Thus, a direct visual comparison may be made between the physical device appearance, the physical layout information, and/or the candidate defect region.

Additionally or alternatively, in some embodiments, displaying the correlation may include displaying a wafer map graphically illustrating a portion of the correlation. In this way, a user may be able to visually compare surface defect scans, such as those provided by a dark-field defect tool, with occurrences of electrical test mismatches and associated candidate defect regions. Thus, a user may be able to identify those defects that lead to electrical test mismatches and those that do not. Further, in some embodiments, correlation information from previously inspected and tested devices may be used to build a correlation database with which subsequently produced devices may be compared.

Figure 24:
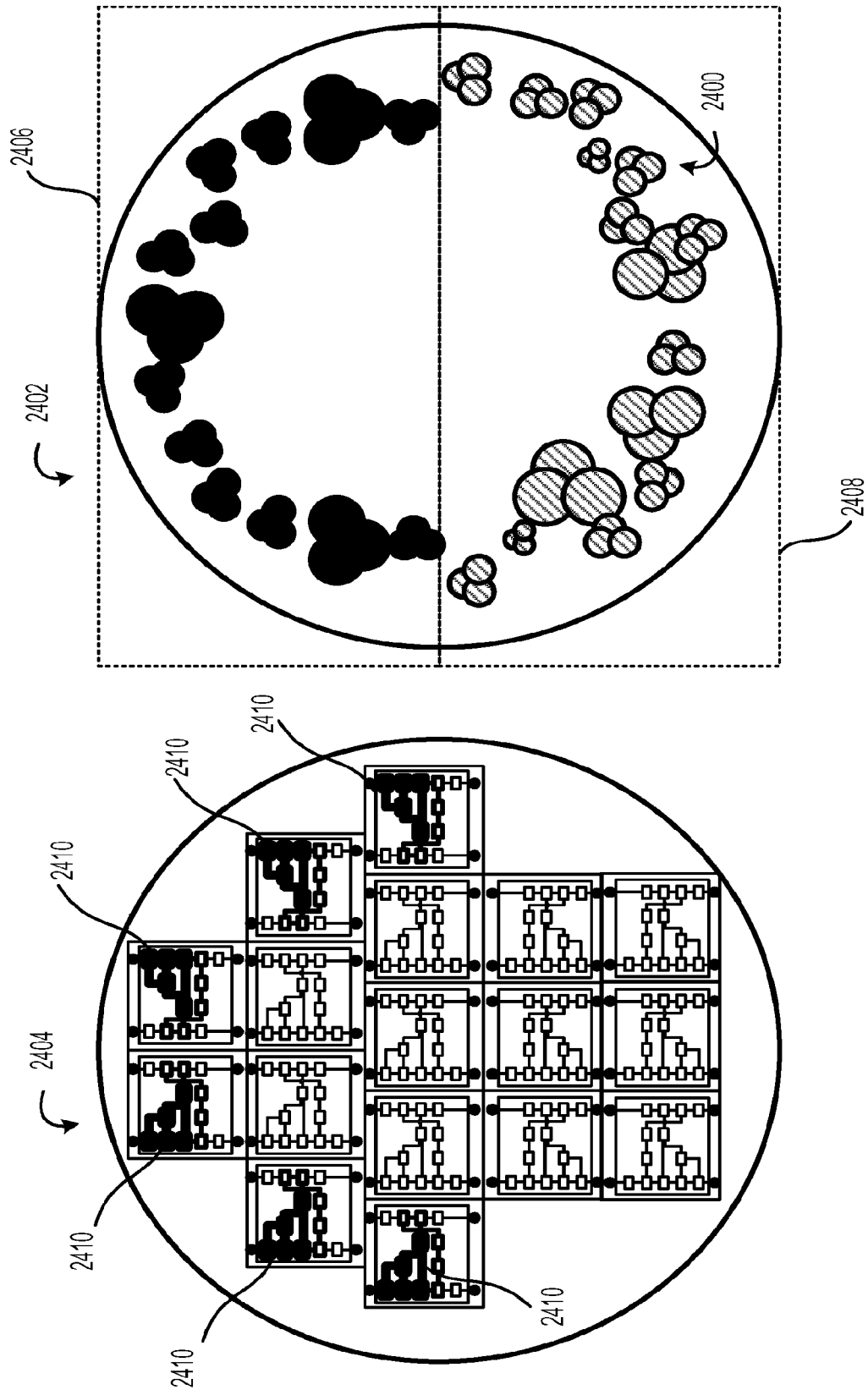
FIG. 24 schematically shows an embodiment of a comparison between a defect wafer map and an electrical test wafer map.

For example, FIG. 24 schematically shows an embodiment of a comparison between a defect wafer map 2402 and an electrical test wafer map 2404. In the example shown in FIG. 24, a first portion 2406 of a ring of defects 2400 locationally corresponds to locations for an arc-shaped region of candidate defect regions 2410 in electrical test wafer map 2404. In contrast, a second portion 2408 does not have corresponding candidate defect regions. Accordingly, visual comparison of defect wafer map 2402 and electrical test wafer map 2404 may provide a user with approaches to identify potential process tools or process operations that may contribute to device defects and failures.

As explained above, the various methods described herein may be performed by any suitable hardware. For example, suitable failure analysis computing devices and/or defect metrology computing devices may be employed to perform embodiments of the methods described herein. In some examples, such computing devices may be included in a failure analysis system.

Figure 25:
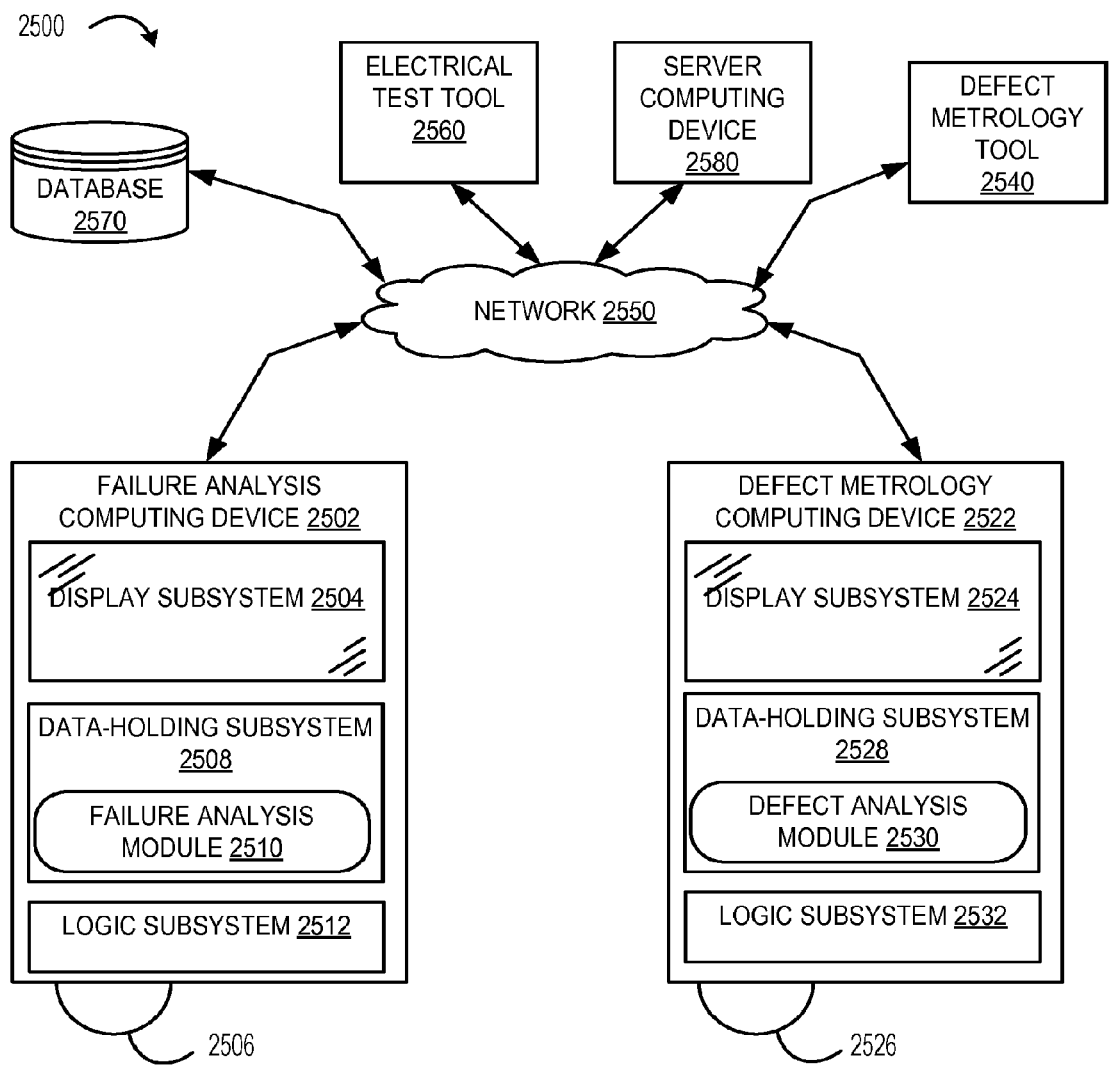
FIG. 25 schematically shows an embodiment of a failure analysis system including a failure analysis computing device and a defect metrology computing device.

FIG. 25 schematically shows an embodiment of a failure analysis system 2500 including a failure analysis computing device 2502 and a defect metrology computing device 2522. Network 2550 links failure analysis computing device 2502 and defect metrology computing device 2522 with defect metrology tool 2540, electrical test tool 2560, database 2570, and server computing device 2580, though it will be appreciated that various manufacturing process tools, EDA tools, and/or ATPG tools may be included in failure analysis system 2500 without departing from the scope of the present disclosure.

Server computing device 2580 may include in-line defect metrology servers, statistical process control data servers, device manufacturing control servers, or any other suitable server or cloud computing environment. Additionally or alternatively, in some embodiments, database 2570 may include defect and/or statistical process control databases, electrical test information databases, ATPG and/or EDA information databases, and databases for storing various correlations and lookup tables referenced and/or generated by failure analysis computing device 2502 and/or defect metrology computing device 2522.

In the embodiment shown in FIG. 25, failure analysis computing device 2502 includes a display subsystem 2504, a logic subsystem 2512, and a data-holding subsystem 2508. A failure analysis module 2510 including instructions for performing embodiments of the various methods disclosed herein is held by data-holding subsystem 2508 for execution by logic subsystem 2512. Failure analysis computing device 2502 also includes removable computer-readable media 2506.

As shown in FIG. 25, defect metrology computing device 2522 includes a display subsystem 2524, a logic subsystem 2532, and a data-holding subsystem 2528. A defect analysis module 2530 including instructions for performing embodiments of the various methods disclosed herein is held by data-holding subsystem 2528 for execution by logic subsystem 2532. Defect metrology computing device 2522 also includes removable computer-readable media 2526.

Failure analysis system 2500 may include other components not shown in FIG. 25. For example, Failure analysis system 2500 may include user input devices such as keyboards, mice, game controllers, cameras, microphones, and/or touch screens.

As used herein, a logic subsystem may include one or more physical devices configured to execute one or more instructions. For example, the logic subsystem may be configured to execute one or more instructions that are part of one or more applications, services, programs, routines, libraries, objects, components, data structures, or other logical constructs. Such instructions may be implemented to perform a task, implement a data type, transform the state of one or more devices, or otherwise arrive at a desired result.

The logic subsystem may include one or more processors that are configured to execute software instructions. Additionally or alternatively, the logic subsystem may include one or more hardware or firmware logic machines configured to execute hardware or firmware instructions. Processors of the logic subsystem may be single core or multicore, and the programs executed thereon may be configured for parallel or distributed processing. The logic subsystem may optionally include individual components that are distributed throughout two or more devices, which may be remotely located and/or configured for coordinated processing. One or more aspects of the logic subsystem may be virtualized and executed by remotely accessible networked computing devices configured in a cloud computing configuration.

As used herein, a data-holding subsystem may include one or more physical, non-transitory, devices configured to hold data and/or instructions executable by the logic subsystem to implement the herein described methods and processes. When such methods and processes are implemented, the state of data-holding subsystem may be transformed (e.g., to hold different data).

In some embodiments, the data-holding subsystem may include removable media and/or built-in devices. For example, the data-holding subsystem may include optical memory devices (e.g., CD, DVD, HD-DVD, Blu-Ray Disc, etc.), semiconductor memory devices (e.g., RAM, EPROM, EEPROM, etc.) and/or magnetic memory devices (e.g., hard disk drive, floppy disk drive, tape drive, MRAM, etc.), among others.

In some embodiments, the data-holding subsystem may include devices with one or more of the following characteristics: volatile, nonvolatile, dynamic, static, read/write, read-only, random access, sequential access, location addressable, file addressable, and content addressable. In some embodiments, the logic subsystem and the data-holding subsystem may be integrated into one or more common devices, such as an application specific integrated circuit or a system on a chip.

As used herein, removable computer-readable storage media may be used to store and/or transfer data and/or instructions executable to implement the methods and processes described herein. Removable computer-readable storage media may take the form of CDs, DVDs, HD-DVDs, Blu-Ray Discs, EEPROMs, and/or floppy disks, among others.

It is to be appreciated that the data-holding subsystem includes one or more physical, non-transitory devices. In contrast, in some embodiments aspects of the instructions described herein may be propagated in a transitory fashion by a pure signal (e.g., an electromagnetic signal, an optical signal, etc.) that is not held by a physical device for at least a finite duration. Furthermore, data and/or other forms of information pertaining to the present disclosure may be propagated by a pure signal.

The term "module" may be used to describe aspects of failure analysis system 2500 that are implemented to perform one or more particular functions. In some cases, such a module may be instantiated via a logic subsystem executing instructions held by a data-holding subsystem. It is to be understood that different modules may be instantiated from the same application, service, code block, object, library, routine, API, function, etc. Likewise, the same module may be instantiated by different applications, services, code blocks, objects, routines, APIs, functions, etc. The term "module" is meant to encompass individual or groups of executable files, data files, libraries, drivers, scripts, database records, etc.

As used herein, a display subsystem may be used to present a visual representation of data held by data-holding subsystem. As the herein described methods and processes change the data held by the data-holding subsystem, and thus transform the state of the data-holding subsystem, the state of display subsystem may likewise be transformed to visually represent changes in the underlying data. Display subsystem may include one or more display devices utilizing virtually any type of technology. Such display devices may be combined with a logic subsystem and/or a data-holding subsystem in a shared enclosure, or such display devices may be peripheral display devices.

As shown in the embodiment illustrated in FIG. 25, network 2550 communicatively couples various aspects of failure analysis system 2500. As nonlimiting examples, network 2550 may be configured for communication via a wireless telephone network, a wireless local area network, a wired local area network, a wireless wide area network, a wired wide area network, etc. In some embodiments, network 2550 may allow computing devices and tools included in failure analysis system 2500 to send and/or receive messages to and/or from other devices via a network such as the Internet.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. At a defect metrology computing device, a method for correlating a location of a defect on a substrate for a semiconductor device to an electrical significance of a device structure at that location, comprising:

receiving data at the metrology computing device that identifies a defect location for the location on the substrate where the defect was detected;

generating at the defect metrology computing device a physical representation of the semiconductor device for the defect location by correlating polygons included in a physical layout file of the semiconductor device with logical cells included in a logical design file of the semiconductor device;

generating at the defect metrology computing device a significance determination indicating whether the defect is located in an electrically significant region of the device by correlating the defect location to the polygons and logical cells included in the physical representation; and displaying the significance determination at the defect metrology computing device.

2. The method of claim 1, wherein the physical representation file includes a correlation of logical design information for the device structure with a physical location of the device structure.

3. The method of claim 2, wherein the physical representation is encrypted.

4. The method of claim 3, wherein access to the physical representation, as encrypted, is based on a user trust level.

5. The method of claim 2, wherein receiving the physical representation includes receiving a portion of the physical representation corresponding to a clipping image of the substrate generated by a defect metrology tool.

6. The method of claim 2, wherein generating the significance determination includes determining whether the defect is within a predetermined threshold distance of the device structure.

7. The method of claim 6, wherein generating the significance determination includes comparing the defect location with the logical design information for the defect structure.

8. The method of claim 7, wherein generating the significance determination includes comparing the defect location with the logical design information for another defect structure on a different layer of the semiconductor device than a layer including the defect.

9. The method of claim 1, wherein displaying the significance determination includes displaying an overlay of a graphical representation of one or more of the defect location and an image of the defect with a graphical representation of one or more of a portion of a physical layout for the semiconductor device corresponding to the defect location and an electrically significant region of the semiconductor device within the portion of the physical layout.

10. At a failure analysis computing device, a method comprising:
receiving a request at the failure analysis computing device from a defect metrology computing device for a data comprising a physical representation of a portion of a logical design for a semiconductor device, wherein the request includes identification of a defect location on a substrate of the semiconductor device;
generating at the failure analysis computing device the requested physical representation data by correlating polygons included in a physical layout file of the semiconductor device with logical cells included in a logical design of the semiconductor device, wherein the physical layout includes a portion corresponding to the defect location; and
sending the physical representation from failure analysis computing device to the defect metrology computing device.

11. The method of claim 10, wherein the physical representation data is encrypted before transmission.

12. The method of claim 10, further comprising: dividing the physical representation into tiles according to the physical layout; selecting a particular tile corresponding to a portion of the physical layout representing the defect location on the substrate; and sending only the particular tile to the defect metrology computing device.

13. The method of claim 12, wherein the physical representation for the particular tile is included in a tile information file, the tile information file including one or more of a tile identifier, an electrical significance identifier, and tile location coordinates.

14. The method of claim 12, wherein the particular tile is configured to be sized and shaped according to a size and shape of a clipping image of the device substrate, the clipping image configured to be obtained by a defect metrology tool.

15. The method of claim 12, wherein the particular tile includes portions of the physical representation corresponding to a plurality of layers of the semiconductor device.

16. At a failure analysis computing device, a non-transitory computer readable storage medium having instructions stored thereon that, responsive to execution by the failure analysis computing device, cause the computing device to perform operations comprising:
receiving electrical test mismatch data for a semiconductor device reported by a failing scan chain comprising at least one failing scan cell;
generating a physical representation of a logical design of the semiconductor device, the physical representation comprising location information for physical instantiations of logical cells and logical interconnections included in the logical design;
based on the physical representation, identifying a suspect logical region corresponding to a physical region of the semiconductor device occupied by at least one logic cone connected with the failing scan chain;
identifying a candidate defect region of the semiconductor device based on the identified suspect logical region;
receiving device manufacturing metrology data for a device manufacturing process used to fabricate the semiconductor device, the device manufacturing metrology data including a fabrication process condition for a device structure located within the physical candidate defect region;
correlating the device manufacturing metrology data to the candidate defect region; and
displaying the correlation.

17. The method of claim 16, wherein generating the physical candidate defect region includes correlating polygons included in a physical layout for the semiconductor device with logical cells included in a logical design for the semiconductor device.

18. The method of claim 16, wherein receiving the device manufacturing metrology data includes receiving one or more of statistical process control data and in-line defect metrology data.

19. The method of claim 16, wherein displaying the correlation comprises displaying a wafer map graphically illustrating a portion of the correlation.

20. The method of claim 16, wherein generating the correlation comprises generating a correlation between two or more of a processing event, a processing tool, and a processing condition.

21. The computer readable storage medium of claim 16 wherein generating the physical representation includes:
receiving logical design data for at least a portion of the semiconductor device, the logical design data including logical cells, each logical cell having a logical cell instance name;
receiving physical layout data for the semiconductor device, the physical layout data including polygons, each polygon having a polygon instance name; and
generating location information for the physical instantiations of the logical cells of the by comparing logical cell instance names with polygon instance names.

22. The computer readable storage medium of claim 16 wherein displaying the correlation includes displaying a wafer map graphically illustrating the correlation.

23. The computer readable storage medium of claim 16 wherein the suspect logical region includes logical cells and interconnections within an overlap region of multiple logic cones.

24. The computer readable storage medium of claim 16 wherein the suspect logical region includes logical cells and interconnections within a union region of multiple logic cones.

* * * * *